United States Patent
Zhu et al.

(10) Patent No.: US 7,811,683 B2
(45) Date of Patent: Oct. 12, 2010

(54) CUTTING TOOL

(75) Inventors: YaoCan Zhu, Satsumasendai (JP); Hideyoshi Kinoshita, Satsumasendai (JP); Takashi Tokunaga, Satsumasendai (JP); Kenji Noda, Satsumasendai (JP); Tatsuyuki Nakaoka, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 287 days.

(21) Appl. No.: 11/863,113

(22) Filed: Sep. 27, 2007

(65) Prior Publication Data
US 2008/0075543 A1 Mar. 27, 2008

(30) Foreign Application Priority Data

| Sep. 27, 2006 | (JP) | ............................. 2006-262928 |
| Oct. 26, 2006 | (JP) | ............................. 2006-291100 |
| Oct. 27, 2006 | (JP) | ............................. 2006-292867 |
| Jan. 26, 2007 | (JP) | ............................. 2007-016330 |
| Jul. 27, 2007 | (JP) | ............................. 2007-195921 |

(51) Int. Cl.
*B32B 9/00* (2006.01)

(52) U.S. Cl. ..................... 428/697; 407/119; 51/307; 51/309; 428/325; 428/472; 428/698; 428/699; 428/701

(58) Field of Classification Search .................. 51/307, 51/309; 428/336, 325, 469, 472, 697, 698, 428/699, 701, 704; 407/119
See application file for complete search history.

(56) References Cited

U.S. PATENT DOCUMENTS

| 5,624,766 A * | 4/1997 | Moriguchi et al. .......... 407/119 |
| 5,853,873 A * | 12/1998 | Kukino et al. .............. 428/336 |
| 5,939,651 A | 8/1999 | Isobe et al. .................. 75/244 |
| 6,007,909 A * | 12/1999 | Rolander et al. ............ 428/704 |
| 6,210,632 B1 * | 4/2001 | Ostlund et al. ................ 419/15 |
| 6,294,129 B1 * | 9/2001 | Waldenstrom ............... 419/18 |
| 6,824,601 B2 * | 11/2004 | Yamamoto et al. .......... 428/699 |
| 7,056,602 B2 * | 6/2006 | Horling et al. .............. 428/698 |
| 7,258,912 B2 * | 8/2007 | Yamamoto et al. .......... 428/697 |
| 7,521,131 B2 * | 4/2009 | Yamamoto ................... 428/698 |

FOREIGN PATENT DOCUMENTS

| JP | 05-069205 | 3/1993 |
| JP | 06-091407 | 4/1994 |
| JP | 06-220571 | 8/1994 |
| JP | 07-310171 | 11/1995 |
| JP | 08-119774 | 5/1996 |
| JP | 08-199283 | * 8/1996 |
| JP | 09-323204 | * 12/1997 |
| JP | 2000-326108 | * 11/2000 |
| JP | 2003-127005 | 5/2003 |
| JP | 2004-074378 | 3/2004 |

(Continued)

*Primary Examiner*—Archene Turner
(74) *Attorney, Agent, or Firm*—Hogan Lovells US LLP

(57) ABSTRACT

A cutting tool having a substrate and a coating layer for coating the surface of the substrate, the coating layer being composed of $Ti_{1-a-b-c-d}Al_aW_bSi_cM_d(C_xN_{1-x})$, where M is at least one selected from Nb, Mo, Ta, Hf and Y, $0.45 \leq a \leq 0.55$, $0.01 \leq b \leq 0.1$, $0.01 \leq c \leq 0.05$, $0.01 \leq d \leq 0.1$, and $0 \leq x \leq 1$. The cutting tool has excellent wear resistance and fracture resistance. The cutting tool may be further provided with a layer composed of at least one selected from carbides, nitrides and carbonitrides of Al and the elements of the groups 4, 5 and 6 of the periodic table.

19 Claims, 3 Drawing Sheets

FOREIGN PATENT DOCUMENTS

| | | | |
|---|---|---|---|
| JP | 2004-074379 | | 3/2004 |
| JP | 2004-115881 | * | 4/2004 |
| JP | 2004-345006 | | 12/2004 |
| JP | 2005-194573 | | 7/2005 |
| JP | 2005-213599 | * | 8/2005 |
| JP | 2006-111915 | | 4/2006 |

* cited by examiner

CUTTING TOOL

BACKGROUND OF THE INVENTION

1. Field of the Invention

The present invention relates to a cutting tool with a coating layer formed on a surface of a substrate.

2. Description of Related Art

In cutting tools and members such as wear resistant members and sliding members, for which wear resistance, sliding properties and fracture resistance are required, the technique of improving wear resistance, sliding properties and fracture resistance are applied by forming various coating layers on the surface of a substrate composed of high hardness sintered body such as WC-based cemented carbide, TiCN-based cermet, diamond or cubic boron nitride crystal (cBN) sintered body, or alternatively ceramics such as alumina or silicon nitride.

Such a coating layer, a TiCN layer and a TiAlN layer are generally widely used, and different coating layers have been developed for purposes of higher wear resistance and improvement of fracture resistance.

For example, Japanese Unexamined Patent Publication No. 7-310171 describes a hard coating on the surface of a cemented carbide base material, in which (TiAl)N is the main component, and part of the metal component thereof is substituted for Si, and part of N (nitrogen) is substituted for B (boron). There is disclosed that the oxidation start temperature of the hard coating can be raised to improve oxidation resistance, thereby improving wear resistance of tools. Japanese Unexamined Patent Publication No. 2006-111915 discloses a hard coating of (TiWSi)N composition, and describes that the adherence between a substrate and cemented carbide can be increased.

With regard to a cutting tool using a cemented carbide substrate containing WC particles, firstly, Japanese Unexamined Patent Publication No. 2003-127005 describes, as Example 2, an end mill where alternate multilayer films of a TiAlSiN layer and an AlSiN layer are coated on the surface of a cemented carbide substrate obtained by mixing raw material powders including WC powder of middle coarse particles having a mean particle diameter of 5.5 μm and WC powder of fine particles having a mean particle diameter of 0.8 μm, followed by forming and sintering. Secondly, Japanese Unexamined Patent Publication No. 2004-74378 also describes, as Example 2, an end mill where a TiAlNbN layer is coated on the surface of a cemented carbide substrate obtained by mixing raw material powders including WC powder of middle coarse particles having a mean particle diameter of 4.0 μm and WC powder of fine particles having a mean particle diameter of 0.8 μm, followed by forming and sintering. Thirdly, Japanese Unexamined Patent Publication No. 6-220571 describes a cutting tool where a TiCN layer and a TiAlN layer are coated on the surface of a cemented carbide substrate using WC crystals as a main component. The WC crystals contain fine particles A having a particle size of 0.1 to 1.0 μm and coarse particles B having a particle size of 3.0 to 10 μm, and the weight ratio of the fine particles A to the coarse particles B, A/B, is 0.1 to 1.0.

With regard to a cutting tool using a Ti-based cermet substrate, Japanese Unexamined Patent Publication No. 2004-74379 discloses a cutting tool where a TiAlNbN layer is formed on the surface of a cemented carbide or cermet substrate. Japanese Unexamined Patent Publication No. 2005-194573 discloses a cermet cutting tool where a hard film such as a TiAlN is coated on the surface of a cermet substrate having a core structure consisting of a core part and a peripheral part surrounding the core part. The core structure is made up of a first hard phase having a mean particle diameter of 0.1 to 0.8 μm, and a second hard phase having a mean particle diameter of 0.8 to 5 μm, which consists only of a peripheral part.

In high speed machining and the machining of difficult-to-cut materials, particularly hardened steels, which are difficult to be machined with the use of cemented carbide or cermet, a cBN sintered body is employed which is the second hardest (diamond is the hardest) and unsusceptible to the reaction with iron.

For example, Japanese Unexamined Patent Publication No. 59-8679 discloses a cutting tool where a coating layer of TiC, TiN, $Al_2O_3$, or the like is formed on the surface of a cBN substrate, and describes that the wear resistance when cutting general steels or cast iron can be improved. Japanese Unexamined Patent Publication No. 8-119774 discloses a cutting tool where a TiAlN coating is formed on the surface of a cBN substrate, and describes that the cutting tool will have a long life even when cutting high hardness difficult-to-cut materials such as hardened steels. Japanese Unexamined Patent Publication No. 2004-345006 discloses a cutting tool having, on the surface of a cBN substrate, a hard coating layer of TiAlSiN composition where the ratio of Ti and Al is changed continuously, and describes that the cutting tool exhibits excellent chipping resistance in high-speed heavy cutting.

Ceramic tools are used when cutting high hardness materials because they are inexpensive and have excellent wear resistance. For example, Japanese Unexamined Patent Publication No. 5-69205 discloses a cutting tool where a coating layer of TiAlN layer or the like is formed on the surface of an $Al_2O_3$—TiC based ceramic substrate, and describes that the cutting tool exhibits an excellent cutting performance when cutting high hardness materials. Japanese Unexamined Patent Publication No. 6-91407 describes that the adherence between a ceramic substrate and a coating layer can be increased to improve fracture resistance by forming at least one physical vapor deposition coating layer of TiC, TiN and TiCN on an $Al_2O_3$—TiC based ceramics containing 0.1 to 5 weight % of an iron family metal.

However, these coating layers of the related art as described in the above publications are not satisfactory in terms of wear resistance and fracture resistance, and there is a demand for a cutting tool provided with a coating layer more excellent in wear resistance and fracture resistance. It cannot be said that the coated cermet tool disclosed in the above publication No. 2005-194573 are satisfactory in the structural configuration of the cermet substrate and in the coating layer configuration.

In the cutting tools having the cBN substrate, even when any one of the abovementioned TiC, TiN and $Al_2O_3$ coating layers, the TiAlN coating layer and the TiAlSiN coating layer is used as the coating layer adhered to the surface of the cBN substrate, cutting performance is insufficient, and a longer life is desired.

Especially, when the cutting tool of the cBN substrate provided with the coating layer is used for hardened steel machining, its tool life cannot be extended for the following reason. That is, in the cutting of the hardened steel, because the surface of a cut article (a material to be cut) has a high hardness, cutting resistance is large and the vicinity of the cutting edge has a high temperature. In particular, temperature is raised in the side surface of the rake face of the cutting edge, which is a passage of chips generated by the cutting. As a result, the coating layer is susceptible of oxidation, and the oxidized coating layer is liable to wear, so that crater wear tends to be advanced in the cutting edge of the tool. Consequently, for example, in light intermittent machining in which continuous machining and intermittent machining are alternately repeated, there is a high risk that the crater wear is advanced during the continuous cutting, and when the intermittent machining is just started, fracture and chipping occur from the advanced crater wear part. This leads to an unsatisfactory tool performance. Further, in order to enhance the hardness of the coating layer itself, it is necessary to increase the residual stress in the coating layer. Because the cBN substrate has high compressive stress in the surface thereof, there is a tendency that when the abovementioned coating layer of the related art is formed on the cBN substrate, this coating layer has a higher residual stress than the case of forming the coating layer on cemented carbide or cermet. As a result, the hardness of the coating layer cannot be enhanced.

Similarly, even when any one of the abovementioned TiAlN coating layer, TiC, TiN or TiCN coating layer and the (TiWSi)N coating layer is used as the coating layer adhered to the surface of the ceramic substrate, cutting performance is insufficient and a longer life is therefore desired.

Especially, when used in severe cutting where the high hardness material cut is subjected to high speed cutting, the tool life cannot be extended for the following reason. That is, in the high speed cutting of the high hardness material, due to the high hardness in the surface of the cut article, the cutting resistance is large and the vicinity of the cutting edge has a high temperature. In particular, the temperature is raised in the side surfaces of the rake face of the cutting edge, which is a passage of chips generated by the cutting. As a result, the coating layer is susceptible of oxidation, and the oxidized coating layer is likely to wear, so that crater wear tends to be advanced in the cutting edge of the tool. Consequently, the crater wear is advanced and, in some cases, there is a high risk that chipping and flaking occur from the crater wear part. This results in an unsatisfactory tool performance. Additionally, because the surface of the ceramic substrate has high hardness and poor toughness, a shock on the coating layer might lead to the fracture at the early stage.

SUMMARY OF THE INVENTION

Accordingly, an advantage of the present invention is to solve the abovementioned problems by providing a cutting tool having excellent oxidation resistance and high wear resistance at a high temperature, as well as high fracture resistance.

Other advantage of the present invention is to provide a cutting tool having a longer life by using, as a substrate, a cBN sintered body, alumina ceramics, or the like.

A cutting tool of the present invention has a substrate and a coating layer for coating a surface of the substrate. The coating layer is composed of $Ti_{1-a-b-c-d}Al_aW_bSi_cM_d(C_xN_{1-x})$, where M is at least one selected from Nb, Mo, Ta, Hf and Y, $0.45 \leq a \leq 0.55$, $0.01 \leq b \leq 0.1$, $0.01 \leq c \leq 0.05$, $0.01 d \leq 0.1$, and $0 \leq x \leq 1$.

In the present invention, because the coating layer is formed of the abovementioned specific composition, the region of this composition region can have a high oxidation start temperature. This permits high oxidation resistance and improvement of wear resistance at the time of cutting. This also suppresses minor chipping that is likely to occur at the ridge of the cutting edge, resulting in high fracture resistance.

When the abovementioned substrate is a cemented carbide substrate comprising a hard phase and a binder phase, it is especially preferable that the hard phase comprising a tungsten carbide phase having two peak tops in a particle size distribution, that is, a peak top on the side of fine particles having a particle size of 0.1 to 0.8 µm, and a peak top on the side of coarse particles having a particle size of 1.5 to 3.0 µm; and that the tungsten carbide phase is bound by 5 to 7 mass % of the binder phase.

Thus, even when the content ratio of the binder phase is as low as 5 to 7 mass % in the cemented carbide, the cutting tool having high wear resistance, stable toughness and high fracture resistance can be achieved by the particle size distribution of the mixture of the coarse particles having the two peak tops, namely the peak top on the fine particle side having a particle size of 0.1 to 0.8 µm, and the peak top on the coarse particle side having a particle size of 1.5 to 3.0 µm, and by the presence of the coating layer of the abovementioned specific composition.

When the substrate is a cermet substrate made up of a binder phase composed of an iron family metal, and a hard phase composed of carbon nitride of the groups 4, 5 and 6 of the periodic table, in which Ti and W are used as essential components, and Ti is contained in the largest amount, it is preferable that the hard phase in the inside of the cermet substrate has a mean particle diameter $d_{in}$ of 0.1 to 1.5 µm, and that there exists a surface layer region where the concentration of W is increased from the inside to the surface in the cermet substrate.

Thus, the coating layer of the specific composition mentioned above is formed on the surface of the cermet substrate having such a feature. As a result, a large amount of "W" element existing in the substrate surface and "W" element existing in the coating layer contribute to the improvement of thermal shock resistance of the substrate surface and the coating layer, as well as good adherence between the substrate and the coating layer. In addition, the coating layer has high hardness and high oxidation resistance, and the substrate also has high hardness. These enable the cutting tool to have high wear resistance and high fracture resistance.

The coating layer of the abovementioned composition may be adhered to the surface of the substrate consisting of a cBN sintered body, particularly a cBN sintered body whose binder phase contains TiN and TiC. That is, in the cutting tool of the invention, the coating layer having the abovementioned composition exhibits high oxidation resistance, enabling suppression of crater wear advance. Additionally, the high hardness and the small residual stress of the coating layer impart excellent wear resistance and chipping resistance. Further, the incorporation of TiN and TiC contained in the binder phase of the cBN sintered body increases the toughness of the cBN sintered body, and lowers the residual stress in the surface of the cBN sintered body, thereby improving the chipping resistance of the cutting tool.

Preferably, the coating layer of the abovementioned composition is adhered to the substrate composed of alumina ceramics containing, in a matrix of alumina particles, 10 to 90 mass % of at least one of titanium or silicon carbide, nitride, carbon nitride and carbon-nitrogen oxide.

That is, the coating layer has high oxidation resistance, enabling suppression of crater wear advance. Further, the high hardness and small residual stress of the coating layer, and the good adherence between the substrate composed of alumina ceramics and the coating layer contribute to excellent wear resistance and chipping resistance of the cutting tool of the present invention.

A method for manufacturing a cut article by using a cutting tool according to the present invention includes the step of putting a cutting edge of the abovementioned cutting tool to an uncut article to obtain the cut article.

DESCRIPTION OF PREFERRED EMBODIMENTS

First Embodiment

Figure 1A:
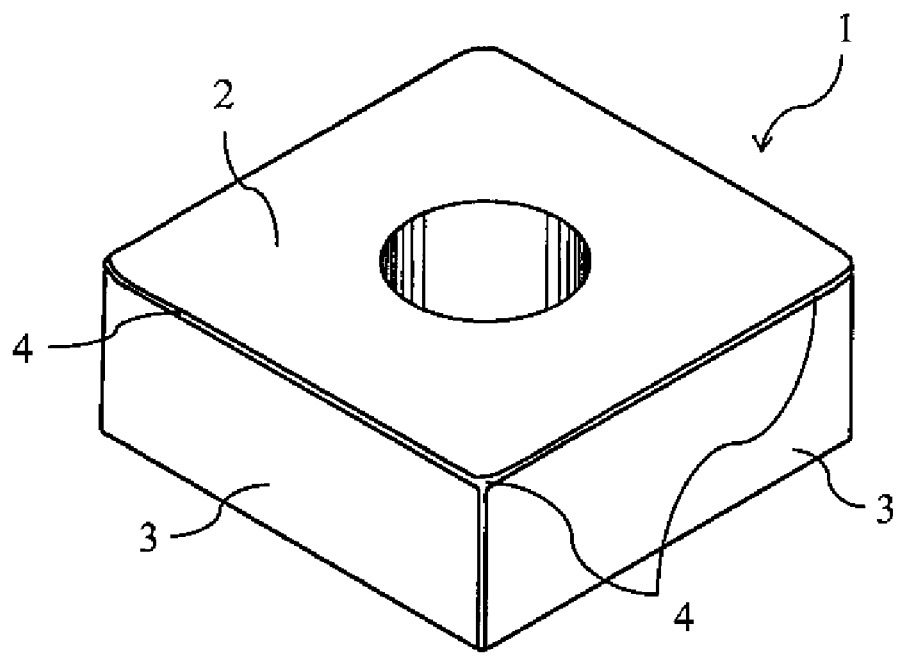
FIGS. 1A and 1B are a schematic perspective view and a schematic sectional view, respectively, showing an example of a cutting tool of the present invention.

In a cutting tool (hereinafter referred to simply as "tool") of the present invention, a cross ridge between a rake face and a flank is shaped like a cutting edge, and a coating layer is formed on the surface of a substrate.

In accordance with the present invention, the coating layer has a composition of $Ti_{1-a-b-c-d}Al_aW_bSi_cM_d(C_xN_{1-x})$, where M is at least one selected from Nb, Mo, Ta, Hf and Y, $0.45 \leq a \leq 0.55$, $0.01 \leq b \leq 0.1$, $0.01 \leq c \leq 0.05$, $0.01 \leq d \leq 0.1$, and $0 \leq x \leq 1$. In this composition region, oxidation start temperature can be raised to improve oxidation resistance and wear resistance. Further, chipping that is likely to occur at the ridge of the cutting edge can be suppressed to increase fracture resistance.

When "a" (Al content) is smaller than 0.45, the oxidation resistance of the coating layer may be lowered. When "a" is larger than 0.55, there is a tendency that the crystal structure of the coating layer is changed from cubic crystal to hexagonal crystal, and hardness is lowered. Particularly preferred range of "a" is $0.48 \leq a \leq 0.52$.

When "b" (W content) is smaller than 0.01, the fracture resistance of the coating layer may be lowered, and chipping is likely to occur at the time of cutting. When "b" is larger than 0.1, the hardness of the coating layer is lowered. Particularly preferred range of "b" is $0.01 \leq b \leq 0.08$.

When "c" (Si content) is smaller than 0.01, the oxidation start temperature is lowered to deteriorate the wear resistance at the time of cutting. When "c" is larger than 0.05, the hardness of the coating layer is lowered. Particularly preferred range of "c" is $0.01 \leq c \leq 0.04$.

When "d" (M content) is smaller than 0.01, oxidation start temperature is lowered. When "d" is larger than 0.1, part of the metal M exists as a low hard phase apart from the cubic crystal, lowering the hardness of the coating layer. Particularly preferred range of "d" is $0.01 \leq d \leq 0.08$.

Here, the metal M is at least one selected from Nb, Mo, Ta, Hf and Y. Among others, Nb or Mo is preferably contained in the interest of the most excellent wear resistance and oxidation resistance.

Carbon (C) and nitrogen (N) as non-metal compositions of the coating layer are for imparting hardness and toughness required for the cutting tool. For the purpose of suppressing droplets (coarse particles) to be generated in the coating layer surface, particularly preferred range of "x" (N content) is $0 \leq x \leq 0.5$.

The composition of the coating layer in the present invention can be measured by energy dispersive X-ray analysis (EDX) method or X-ray photoelectron spectroscopy (XPS) method.

Even if the coating layer is thickened, the coating layer is unsusceptible to chipping. Even if the coating layer has a thickness of 0.5 to 6 µm, flaking and chipping in the coating layer can be avoided to retain sufficient wear resistance.

It is desirable, in the interest of improvement of chipping resistance, to employ a multilayer, namely the coating layer and other layer of at least one selected from carbides, nitrides and carbon nitrides of Al and elements of the groups 4, 5 and 6 of the periodic table. Examples of the elements of the groups 4, 5 and 6 of the periodic table are Ti, V, Cr, Zr, Nb and Mo. The total thickness of the multilayer consisting of the coating layer and other layer is preferably 0.5 to 8.0 µm, in the interest of prevention of flaking and chipping in the coating layer and retention of sufficient wear resistance.

The multilayer may be attained by alternately stacking the coating later and other layer. Preferably, the multilayer is made up of two layers where the coating layer and other layer are stacked in the order named or in the reverse order.

As a suitable substrate, there are cemented carbide and cermet, which consist of a hard phase composed mainly of tungsten carbide or titanium carbon nitride, and a binder phase composed mainly of an iron family metal such as cobalt or nickel; and hard materials such as an ultra high pressure sintered body, which can be obtained by sintering, at an ultra high pressure, a hard phase made of ceramic composed mainly of silicon nitride or aluminium oxide, polycrystalline diamond or cubic boron nitride, and a binder phase composed of ceramic or an iron family metal.

<Manufacturing Method>

A method of manufacturing a cutting tool of this first embodiment will be described below.

Firstly, a tool-shaped substrate is prepared by a known method. A coating layer is then formed on the surface of the substrate.

As a method of forming a coating layer, physical vapor deposition (PVD) method such as ion plating method or sputtering method can be applied suitably. An example of the method will be described in detail. When the coating layer is formed by ion plating method, using a metal target or a compound alloy target, which contains independently metal titanium (Ti), metal aluminium (Al), metal tungsten (W), metal silicon (Si), metal M (M is at least one selected from Nb, Mo, Ta, Hf and Y), the film-forming is performed by allowing a metal source to be vaporized and ionized by arc discharge or grow discharge, and at the same time, reacted with nitrogen ($N_2$) gas as a nitrogen source, or alternatively methane ($CH_4$) or acetylene ($C_2H_2$) gas as a carbon source.

By admitting, as a film-forming atmosphere, nitrogen ($N_2$) gas and argon (Ar) gas in a ratio of 1 to 10 Pa, the adherence and hardness of the coating layer with respect to the substrate can be improved. At this time, for the purpose of increasing the adherence and hardness of the coating layer with respect to the substrate, the mixing ratio of nitrogen ($N_2$) gas and argon (Ar) gas is preferably that the flow rate of argon gas to nitrogen is 1:9 to 4:6.

When the coating layer is formed by ion plating method or sputtering method, a bias voltage of 30 to 200V is preferably applied so that the crystal structure and orientation of the coating layer can be controlled to manufacture the coating layer of high hardness, and increase the adherence to the substrate.

Second Embodiment

In a second preferred embodiment of present invention, a substrate is composed of cemented carbide where a tungsten carbide phase is bound by a 5 to 7 mass % of a binder phase. The tungsten carbide phase has two peak tops in the particle size distribution, namely a peak top on the side of fine particles having a particle size of 0.1 to 0.8 μm, and a peak top on the side of coarse particles having a particle size of 1.5 to 3.0 μm.

The tool provided with the cemented carbide of the construction mentioned above has high wear resistance and high fracture resistance. Specifically, when the peak top position on the fine particle side is 0.1 μm or more, the toughness of the substrate becomes high, and hence the fracture resistance of the tool is not lowered. When the peak top position on the fine particle side is 0.8 μm or less, the hardness of the substrate is high, and hence the wear resistance of the tool is improved. On the other hand, when the peak top position on the coarse particle side is 1.5 μm or less, the effect of improving the toughness of the substrate becomes high and hence the fracture resistance of the tool is improved. When the peak top position on the coarse particle side is 3.0 μm or less, the toughness of the substrate becomes high and the wear resistance of the tool is improved without lowering the hardness of the substrate.

Further, in the cemented carbide substrate as a combination of fine particles and coarse particles as in the present invention, if cracks occur by the shock on the substrate, the dispersed coarse particles can suppress the cracks from spreading, enabling improvement of fracture resistance of the tool. On the contrary, under a single peak top, not having two peak tops existing respectively one on each side of the fine particle side and the coarse particle side, the effect of improving toughness while the hardness of a base remains high is small.

When the content of the binder phase of the cemented carbide substrate is 5 mass % or more, the fracture resistance of the tool is improved. When the content of the binder phase 7 mass % or less, wear resistance is high, and especially cutting performance becomes sufficient in a cutting process in which the dimension of the surface to be cut and the surface roughness become issues as in the finishing process.

Here, it is desirable that the abovementioned tungsten carbide phase has a mean particle diameter of 0.5 to 1.0 μm, in the interest of further improvement of wear resistance and fracture resistance. The mean particle diameter of the tungsten carbide phase can be obtained in accordance with the method of measuring a mean particle diameter as defined in CIS-019D-2005.

The coating layer to be coated on the surface of the substrate is the same as the coating layer in the first preferred embodiment. However, when the substrate is the above-mentioned cemented carbide, the coating layer may have a composition expressed by $Ti_{1-a-b-c-d}Al_aW_bSi_cM_d(C_xN_{1-x})$, where M is at least one selected from Nb, Mo, Ta, Hf and Y, $0.45 \leq a \leq 0.55$, $0.01 \leq b \leq 0.1$, $0 \leq c \leq 0.05$, $0 \leq d \leq 0.1$, and $0 \leq x \leq 1$.

In the abovementioned composition region of the coating layer, the oxidation start temperature can be raised to enhance oxidation resistance. Therefore, the wear resistance during cutting can be improved to suppress chipping that is likely to occur at the ridge of the cutting edge, thereby enhancing fracture resistance.

<Manufacturing Method>

A method of manufacturing a surface-coated cutting tool in the second embodiment will be described below.

When manufacturing a tool-shaped cemented carbide substrate, to tungsten carbide (WC) powder of fine particle having a mean particle diameter of 0.3 to 1.0 μm, and tungsten carbide (WC) powder of coarse particles having a mean particle diameter of 1.5 to 9.0 μm 6 mass % of metal cobalt (Co) powder having a mean particle diameter of 1.2 μm, and 0.1 to 2.0 mass % of chromium carbide ($Cr_3C_2$) are added and mixed for 10 to 20 hours by using an attritor mill. The mixed powder is formed in granules by a spray drier. The granules are press molded in a throw away insert shape, followed by debindering process. This is then sintered at 1350 to 1450° C. under vacuum of 0.01 Pa for 0.5 to 2.0 hours, thereby obtaining the cemented carbide substrate.

In the same manner as in the first embodiment, the coating layer is formed on the surface of the abovementioned substrate.

The second preferred embodiment is otherwise similar to the first embodiment, and the description thereof is therefore omitted.

Third Embodiment

A cutting tool of a third preferred embodiment will be described with reference to the schematic perspective view in FIG. 1A, the schematic sectional view in FIG. 1B, and the scanning electron micrographs in the vicinity of the surface and the inside of the cutting tool shown in FIGS. 2A and 2B, respectively.

Figure 1B:
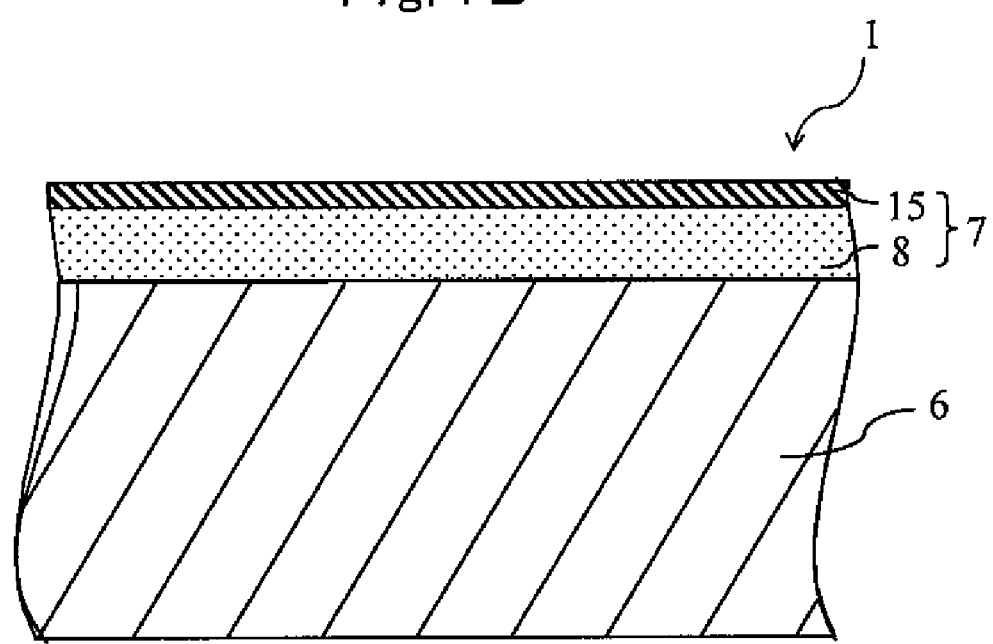
Figure 2A:
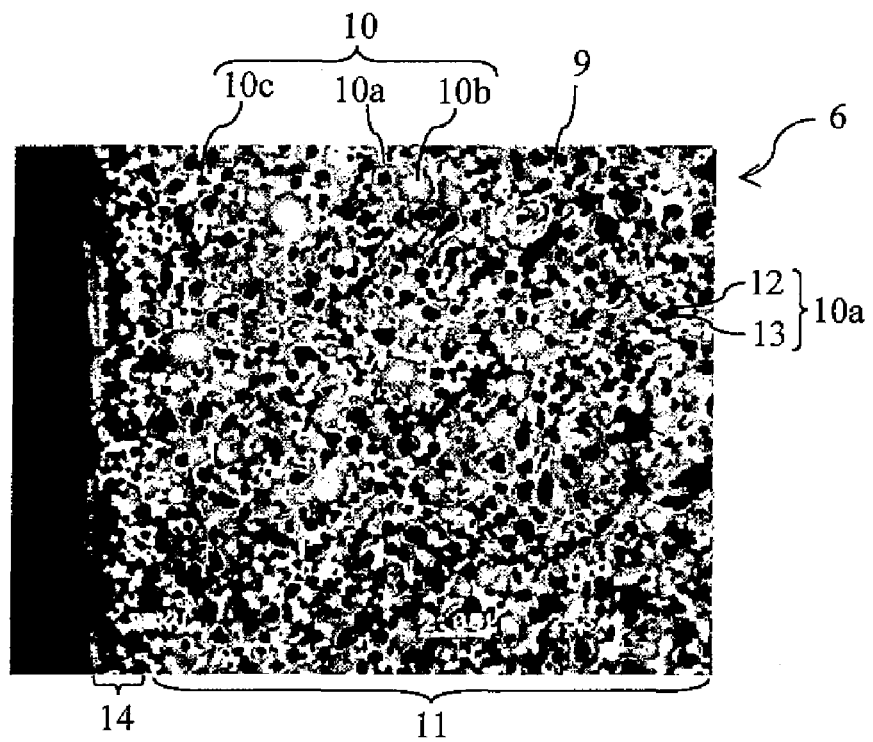
FIGS. 2A and 2B are scanning electron micrographs of the vicinity of the surface of and the inside of a cermet substrate in a third preferred embodiment, respectively.
Figure 2B:
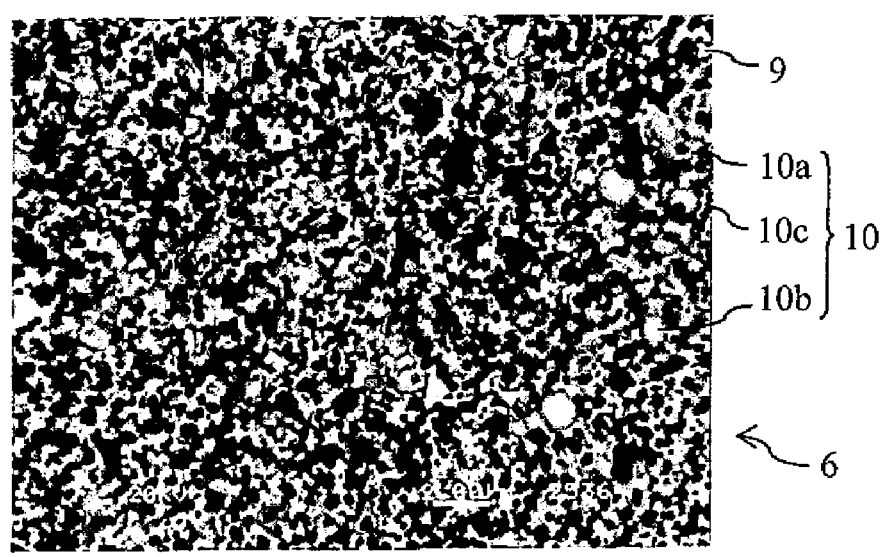

As shown in FIG. 1A, in the cutting tool 1 of the third preferred embodiment, a cross ridge between a rake face 2 and a flank 3 is shaped like a cutting edge 4, and as shown in FIG. 1B, a coating layer 7 is formed on the surface of a substrate 6. The substrate 6 is composed of cermet.

That is, the substrate 6 is made up of a binder phase 9 composed of an iron family metal such as Co or Ni, and a hard phase 10 composed of carbon nitride of metals of the groups 4, 5 and 6 of the periodic table, in which Ti and W are used as essential components, and Ti is contained in the largest amount. The hard phase 10 has a mean particle diameter $d_{in}$ of 0.1 to 1.5 μm. There exists a surface layer region 11 where the concentration of metal W elements is increased from the inside to the surface in the substrate.

The coating layer 7 has a coating layer 8 and other coating layer 15. The other coating layer 15 may be omitted.

The coating layer 8 is the same as the coating layer in the first preferred embodiment. However, when the substrate 6 is the abovementioned cermet, the coating layer 8 may have a composition expressed by $Ti_{1-a-b-c-d}Al_aW_bSi_cM_d(C_xN_{1-x})$ where M is at least one selected from Nb, Mo, Ta, Hf and Y, $0.45 \leq a \leq 0.55$, $0.01 \leq b \leq 0.1$, $0 \leq c \leq 0.05$, $0.01 \leq d \leq 0.1$, and $0 \leq x \leq 1$.

With the construction of the substrate 6 and the coating layer 7, a large amount of the W elements existing in the surface of the substrate 6, and the W elements contained in the coating layer 8 improve the thermal conductivity in the surface of the substrate 6 and in the coating layer 8. This enhances the thermal shock resistance of the tool 1, and also enhances the adherence between the substrate 6 and the coating layer 7. Further, the coating layer 8 has high hardness and high oxidation resistance, and the hard phase 10 of the substrate 6 has a small particle diameter and high hardness. As a result, the tool 1 has high wear resistance and high thermal shock resistance.

In the scanning electron micrographs of the cross-section of the substrate 6 (FIGS. 2A and 2B), the hard phase 10 is made up of a first hard phase 10a having a core structure where a grayish white peripheral part 13 exists around a black core part 12, and a second hard phase 10b consisting of a single grayish white part, or alternatively, made up of the first hard phase 10a, the second hard phase 10b and a third hard phase 10c consisting of a single black part. The first hard phase 10a in the inside of the substrate 6 has a mean particle diameter $d_{1in}$ of 0.1 to 1.3 μm, the second hard phase 10b has a mean particle diameter $d_{2in}$ of 0.2 to 1.5 μm, and the third hard phase 10c has a mean particle diameter $d_{3in}$ of 0.2 to 2.0 μm. This enables the substrate 6 to have excellent hardness, thermal conductivity and toughness. As used here, the term "grayish white" means to look like a color tone close to white or a color tone close to gray, depending on the photographing condition.

In the hard phase 10, the black core part 12 and the third hard phase 10c contain 80 mass % or more of Ti, and the grayish white peripheral part 13 of the first hard phase 10a and the second hard phase 10b contain more metal, except for Ti, of the groups 4, 5 and 6 of the periodic table than the black part. Consequently, the substrate 6 can have high hardness and improved thermal conductivity and toughness, thus imparting high wear resistance and high thermal shock resistance to the tool 1.

The content of the iron family metal contained in the substrate 6 is preferably 4 to 14 mass % from the viewpoint of balance between the hardness and toughness of the substrate 6. It is desirable to contain, as an iron family metal, 65 mass % or more of Co to the total amount of the iron family metal, for the purpose of enhancing the thermal shock resistance of the cutting tool. In order to retain good sintering properties of the substrate 6 so that the substrate 6 can have a smooth sintered surface, it is desirable to contain, as an iron family iron, Ni in a ratio of 5 to 50 mass %, particularly 10 to 30 mass %.

Having part of the core part 12 of the first hard phase 10a contain the iron family metal enables improvement of fracture resistance, while retaining high the hardness and toughness of the substrate 6.

Preferably, the area ratio $S_{1in}$ of the first hard phase 10a is 40 to 80 area %, the area ratio $S_{2in}$ of the second hard phase 10b is 5 to 40 area %, and the area ratio $S_{3in}$ of the third hard phase 10c is 0 to 30 area %, to the entire structure in the residual structure of the substrate 6. This enables the substrate 6 to have high hardness and excellent toughness.

In this construction, the ratio of a mean particle diameter $d_{sf}$ of the hard phase 10 in a surface layer region 11 and the mean particle diameter $d_{in}$ ($d_{sf}/d_{in}$) is preferably 1.1 to 1.8, for the purposes of improving the toughness in the surface of the substrate 6, and preventing chipping and flaking of the coating layer 7. The existence of the surface layer region 11 can be checked by observing a section including the surface of the substrate with a scanning electron microscope photograph. That is, the region near 1000 μm depth from the surface of the substrate 6 is observed as an organization of an internal region, and the mean particle diameter of the first hard phase 10a in the internal region is measured. Similarly, the mean particle diameter of the first hard phase 10a in near the surface of the substrate 6 is measured, and it is compared with the mean particle diameter in the inside. As a result, when ($d_{sf}/d_{in}$) is larger than 1, it can be judged that the surface region 11 exists in the substrate 6. On the contrary, when ($d_{sf}/d_{in}$) is 1 or less, it can be judged that the surface region 11 does not exist in the substrate 6. The desirable thickness of the surface region 11 is about 20-200 μm from the surface of the substrate 6.

The ratio of an area ratio $S_{1sf}$ of the first hard phase 10 in the surface layer region 11 and the area ratio $S_{1in}$ ($S_{1sf}/S_{1in}$) is preferably 0.3 to 0.7, in the point that the toughness in the surface of the substrate 6 can be improved to suppress chipping and flaking of the coating layer 7. The ratio of an area ratio $S_{2sf}$ of the second hard phase 10b in the surface layer region 11 and the area ratio $S_{2in}$ ($S_{2sf}/S_{2in}$) is preferably 1.5 to 4, in the point that the hardness and thermal conductivity in the surface of the substrate 6 can be enhanced to improve the wear resistance and thermal shock resistance of the tool 1.

The particle diameter of the hard phase 10 in the present invention is measured in accordance with the method of measuring a mean particle diameter as defined in CIS-019D-2005. At this time, the first hard phase 10a having the core structure is measured regarding, as a hard phase, the area extending to the outer edge of the peripheral part including the core part 12 and the peripheral part 13.

A ultrathin surface region 14, where the area ratio $S_{1ss}$ of the first hard phase 10a is not less than 80 area %, is preferably present in a depth region of not more than 5 μm in the surface part of the surface layer region 11, in the interest of enhancement of the adherence of the coating layer 7 to be formed on the surface of the substrate 6.

When the coating layer 8 to be coated on the surface of the substrate 6 corresponds to the abovementioned composition region, the oxidation start temperature can be raised and hence oxidation resistance can be enhanced, improving the wear resistance when the tool 1 performs cutting. Additionally, chipping that is likely to occur at the tip of the cutting edge 4 can be suppressed to permit high fracture resistance.

It is desirable that the other constitution of the coating layer 7 is the same as that of the first embodiment. In addition, when using as a cutting tool for precision parts machining, the thickness of the coating layer 7 is preferably 0.5 μm to 2 μm.

<Manufacturing Method>

A method of manufacturing the tool in the third embodiment mentioned above will be described below.

A mixed powder is prepared by mixing (i) TiCN powder having a mean particle diameter of 0.1 to 1.2 μm, particularly 0.2 to 0.9 μm, (ii) one selected from TiN powder, carbide powder and carbon nitride powder of the abovementioned other metal, each having a mean particle diameter of 0.1 to 2 μm, and (iii) Co powder or Ni powder, nitride powder.

In the present invention, it is important to control the mean particle diameter of the TiCN raw material powder to 0.1 to 1.2 μm. When the mean particle diameter is smaller than 0.1 μm, the raw material is aggregated and cermet has a non-uniform structure. Exceeding 1.2 μm, the cermet cannot have the abovementioned structure.

By using, as raw material powder, both of normal TiCN powder and TiCN—Co/Ni-doped powder containing in advance a binder metal of Co and/or Ni, it is easy to generate a hard phase containing an iron family metal in the core part.

Preferably, the iron family metal powder, namely Co powder and Ni powder have a mean particle diameter of not more than 2 μm, particularly 0.05 to 1.5 μm, for the purpose of enhancing the sintering properties of the cermet substrate. More preferably, solid solution powder containing Co and Ni in a predetermined ratio is used as a binder metal raw material powder, for the purpose of further enhancing the sintering properties. The mean particle diameter of other raw material powder is preferably 0.05 to 3 μm.

Next, to the above mixed powder, a binder is added and then formed in a predetermined shape by a known forming method such as press forming, extrusion forming, or injection forming.

The TiC fine particles having the above-mentioned predetermined shape, size and density can be deposited and dispersed in the hard particles by performing sintering under the following conditions. The sintering conditions are as follows: After raising a temperature to a first sintering temperature of 1050-1250° C. at the rate A of 5° C./min to 15° C./min, (a) temperature is raised at the rate B of 0.1° C./min to 3° C./min from the first sintering temperature to 1300° C.; (b) temperature is raised at the rate C of 5° C./min to 15° C./min in an atmosphere of nitrogen partial pressure of 10 to 150 Pa, from 1300° C. to a second sintering temperature of 1400 to 1600° C.; (c) retaining the inert gas filled in the temperature raising step (b), the maximum temperature of the temperature raising step (b) is retained for a predetermined time; and (d) the temperature is lowered in the state where the inert gas is filled.

The substrate 6 having the abovementioned structure can be manufactured by raising temperature at the temperature raising rate during sintering, and lowering temperature in the state where a predetermined amount of the inert gas is filled.

Next, the coating layer 7 is formed on the surface of the substrate 6. The coating layer 8 is formed in the same manner as in the first embodiment. The third embodiment is otherwise similar to the first embodiment, and the description thereof is therefore omitted.

Fourth Embodiment

The cutting tool of the fourth preferred embodiment will be described with reference to the schematic perspective view in FIG. 3A, and the schematic sectional view in FIG. 3B.

Figure 3A:
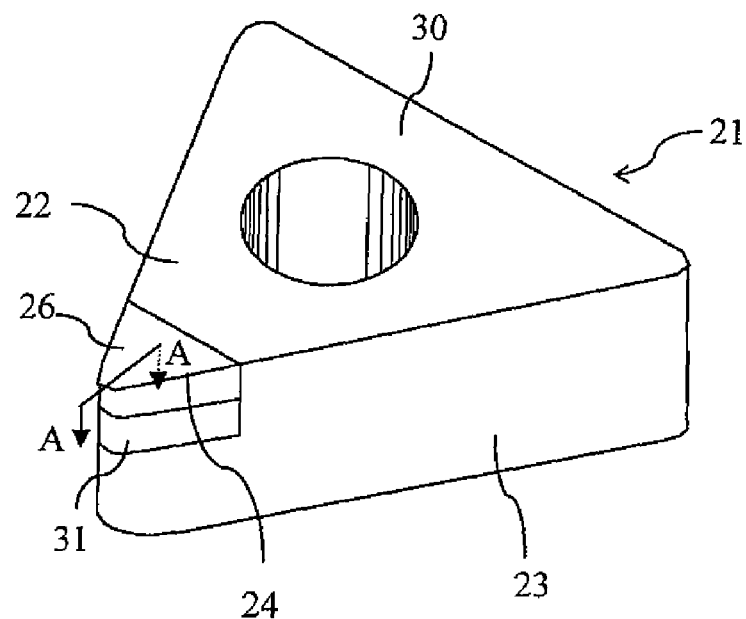
FIGS. 3A and 3B are a schematic perspective view and a schematic sectional view, respectively, showing other example of the cutting tool of the present invention.
Figure 3B:
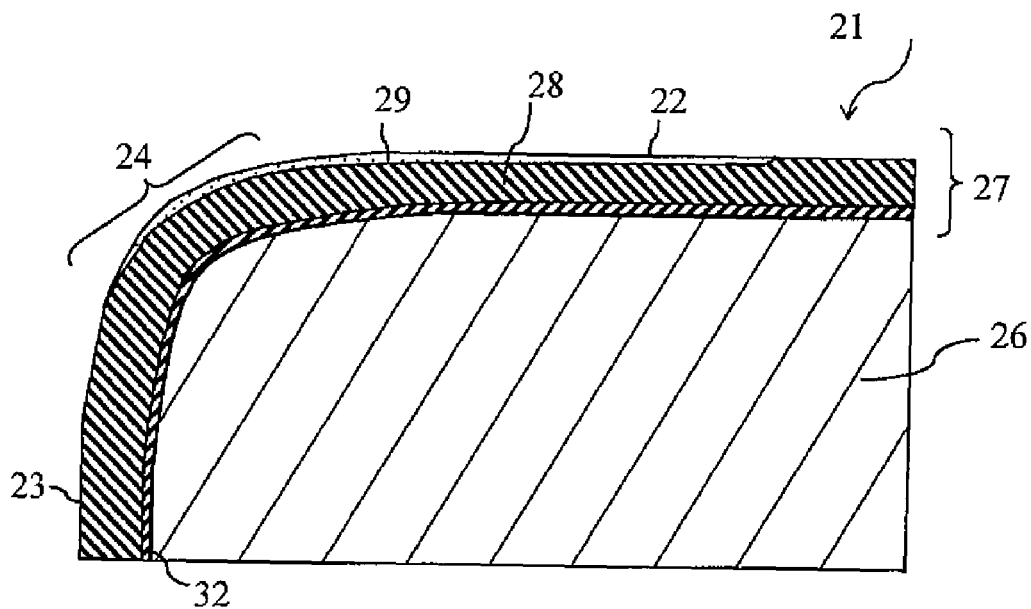

As shown in FIG. 3A, in a cutting tool 21 of the fourth embodiment, a cross ridge between a rake face 22 and a flank 23 is shaped like a cutting edge 24, and as shown in FIG. 3B, a hard coating layer 27 is formed on the surface of a substrate 26 consisting of cBN sintered body. The substrate 26 has a structure brazed through a support plate 31 at the ridge of a tip body 30.

The hard coating layer 27 is the same as the coating layer in the first embodiment. However, when the substrate 26 is the abovementioned cBN sintered body, the coating layer 27 may have a composition expressed by $T_{1-a-b-c-d}Al_aW_bSi_cM_d(C_xN_{1-x})$, where M is at least one selected from Nb, Mo, Ta, Hf and Y, $0.45 \leq a \leq 0.55$, $0.01 \leq b \leq 0.1$, $0 \leq c \leq 0.05$, $0.01 \leq d \leq 0.1$, and $0 \leq x \leq 1$.

In the abovementioned composition region of the coating layer 28, oxidation start temperature can be raised to enhance oxidation resistance. This improves the wear resistance of the tool 21 during cutting, and particularly suppresses of crater wear advance when machining hard-to-cut materials such as hardened steel. Additionally, the residual stress within the coating layer 28 can be reduced to suppress chipping that is likely to occur at the tip of the cutting edge 24, thereby enhancing fracture resistance.

It is desirable that other constitution of the hard coating layer 27 is the same as that of the first embodiment. In addition, the thickness of the coating layer 27 is preferably 0.5 μm to 5 μm when using as a cutting tool for hardened steel machining. The thickness of the coating layer 27 is preferably 1 μm to 3 μm when using as a cutting tool for cast iron machining.

On the other hand, the cBN (cubic boron nitride) sintered body constituting the substrate 26 has the structure that a continuous binder phase matrix (hereinafter referred to simply as a binder phase) binds the periphery of the cBN (cubic boron nitride) particles constituting the hard phase, and an intermediate phase for adhering the cBN particles and the binder phase is formed between the cBN particles and the binder phase.

In the binder phase, it is preferable to establish the structure that carbide of one type or more than two types of elements selected from the group consisting of metals of the groups 4, 5 and 6 of the periodic table (hereinafter referred to simply as carbide), and nitride of one type or more than two types of elements selected from the group consisting of metals of the groups 4, 5 and 6 of the periodic table (hereinafter referred to simply as nitride) coexist, that is, the carbide and the nitride exist independently in the binder phase matrix. Particularly, for the purpose of enhancing the toughness of the cBN sintered body (the substrate 26), it is desirable that titanium carbide (TiC) as the carbide, and titanium nitride (TiN) as the nitride are allowed to exist in the cBN sintered body (the substrate 26).

The existence of the carbide and the nitride in the cBN sintered body (the substrate 26) can be confirmed by performing mirror finish of the cBN sintered body (the substrate 26), and observing the polished surface under a metallographical microscope at 100 to 1000 power. When TiN and TiC are present, it can be confirmed that the brightest portion is TiN, the darkest portion is the cBN particles, and the portion having the middle brightness is TiC. Alternatively, this may be confirmed by performing a mapping of composition analysis. For example, when WDS (wavelength dispersive X-ray spectroscopy) of EPMA (electron probe microanalysis) is used for mapping, it is possible to confirm by performing a mapping for each of carbon, nitrogen, boron and metal element compositions. The abovementioned area ratio can be easily calculated by image analysis of the metallographical microscopic images.

The particle diameter of the cBN particles is preferably in the range of 0.2 to 5.0 μm, particularly 0.5 to 3.0 μm, in terms of wear resistance and strength. The mean particle diameter of the cBN is measured in accordance with the method of measuring an mean particle diameter of cemented carbide as defined in CIS-019D-2005.

Preferably, an intermediate phase, which is composed of an intermetallic compound, carbide, nitride, carbon nitride, boride, boron carbide, boron nitride or oxide of one type or more than two types of elements selected from the group consisting of metals, iron family metals and Al of the groups 4, 5 and 6 of the periodic table, exists in the outer peripheral part of the cBN particles in the interest of firm retention of the cBN particles.

<Manufacturing Method>

A method of manufacturing the tool in the fourth embodiment mentioned above will be described below.

For example, as raw material powders, (a) cBN raw material powder having a predetermined mean particle diameter in the range of 0.2 to 3 μm, (b) carbide powder of one type or more than two types of elements selected from metals of the groups 4, 5 and 6 of the periodic table, each having a mean particle diameter of 0.2 to 3 μm, particularly 0.5 to 3 μm, (c) nitride of one type or more than two types of elements selected from metals of the groups 4, 5 and 6 of the periodic table, having a mean particle diameter of 0.2 to 3 μm, particularly 0.5 to 3 μm, and (d) if needed, raw material powder of Al or at least one of iron family metals, each having a mean particle diameter of 0.5 to 5 μm, are weighed in a specific composition. This is then milled and mixed by ball mill for 16 to 72 hours. More preferably, the carbide raw material powder and the nitride raw material powder have a mean particle diameter in the range of 1 to 3 μm.

Thereafter, if necessary, the above mixed powder is formed in a predetermined shape by using a known forming method such as press forming, casting, injection forming or extrusion forming.

Subsequently, the formed body is then put in an ultra high pressure sintering apparatus, together with a separately prepared support plate of cemented carbide, and held for 10 to 30 minutes at a predetermined temperature in the range of 1200 to 1600° C. under a pressure of 4 to 6 GPa, thereby obtaining the substrate 26 composed of the cubic boron nitride sintered body according to the present invention. In order to achieve the structure that the carbide of the groups 4, 5 and 6 of the periodic table, and the nitride of the groups 4, 5 and 6 of the periodic table are present individually, it is preferable to set that the temperature raising and lowering rates are 30 to 50° C. per minute, the predetermined temperature is in the range of 1200 to 1600° C., the pressure is 5 GPa, and the heating hold time is 10 to 15 minutes.

Next, the hard coating layer 27 is formed on the surface of the substrate 26. The coating layer 28 is formed in the same manner as in the first embodiment.

The fourth embodiment is otherwise similar to the first embodiment, and the description thereof is therefore omitted.

Fifth Embodiment

The cutting tool of the fifth embodiment of present invention will be described with reference to the above-mentioned schematic perspective view in FIG. 1A, and the above-mentioned schematic sectional view in FIG. 1B.

As shown in FIG. 1A, in a cutting tool 1 of this embodiment, a cross ridge between a rake face 2 and a flank 3 is shaped like a cutting edge 4, and as shown in FIG. 1B, a coating layer 7 is formed on the surface of a substrate 6. The substrate 6 of a fifth preferred embodiment is composed of alumina ceramics.

That is, the alumina ceramics constituting the substrate 6 contains, in the matrix of alumina particles, 10 to 90 mass % of at least one selected from titanium or silicon carbide, nitride, carbonitride and oxicarbonitride. By incorporating titanium or silicon carbide, nitride, carbon nitride or carbon-nitrogen oxide into the alumina ceramics, the strength and toughness of the substrate can be enhanced, and the adherence with the coating layer 7 can be enhanced. The content of at least one of titanium or silicon carbide, nitride, carbon nitride and carbon-nitrogen oxide is preferably 20 to 40 mass % for the purpose of eliminating the thermal expansion coefficient difference from the coating layer 8. By imparting conductivity to alumina ceramics so as to obtain good film-forming property by PVD method, it is preferable to contain titanium carbide or titanium carbon nitride in a ratio of 20 to 40 mass %.

It is more preferable to incorporate at least one of cobalt and nickel in a ratio of 0.05 to 10 mass % into the alumina ceramics, for the purposes of enhancing the toughness of the alumina ceramics and enhancing the adherence with the coating layer. That is, with physical vapor deposition method, the coating layer having high adherence can be formed stably by imparting conductivity to the alumina ceramics. Preferably, the content ratio of at least one of cobalt and nickel is 0.5 to 2 mass %.

The mean particle diameter of alumina particles contained in the alumina ceramics is 0.05 to 3 μm, preferably 0.1 to 0.5 μm, from the viewpoints of wear resistance and strength. The mean particle diameter of at least one of titanium or silicon carbide, nitride, carbon nitride and carbon-nitrogen oxide is 0.2 to 3 μm, preferably 0.5 to 1 μm, from the viewpoints of improvements in wear resistance and toughness, as well as adjustment of conductivity. The particle diameter of alumina particles and the abovementioned compound particles of titanium or silicon is measured in accordance with the method of measuring an mean particle diameter of cemented carbide as defined in CIS-019D-2005.

The coating layer 7 has a coating layer 8 and other coating layer 15. The other coating layer 15 may be omitted.

The coating layer 8 is the same as the coating layer in the first preferred embodiment. However, when the substrate 6 is the abovementioned alumina ceramics, the coating layer 8 may have a composition expressed by $Ti_{1-a-b-c-d}Al_aW_bSi_cM_d(C_xN_{1-x})$, where M is at least one selected from Nb, Mo, Ta, Hf and Y, $0.45 \leq a \leq 0.55$, $0.01 \leq b \leq 0.1$, $0 \leq c \leq 0.05$, $0.01 \leq d \leq 0.1$, and $0 \leq x \leq 1$.

In the abovementioned composition region of the coating layer 8, the oxidation start temperature can be raised to enhance oxidation resistance. This improves the wear resistance of the tool 1 during cutting, and particularly suppresses the advance of crater wear when machining hard-to-cut materials such as hardened steel. Additionally, the residual stress within the coating layer 8 can be reduced and hence chipping that is likely to occur at the tip of the cutting edge 4 can be suppressed to enhance fracture resistance.

Since the coating layer 8 does not have so high residual stress, if it is thickened, the coating layer 7 is unsusceptible to chipping. Even if the coating layer have a film thickness of 0.5 to 10 μm, flaking and chipping can be prevented by the residual stress of the coating layer 8 itself. As a result, fracture resistance is high, and sufficient wear resistance can be retained. The film thickness of the coating layer is preferably in the range of 0.5 to 5 μm.

It is desirable that other constitution of the coating layer 7 is the same as that of the first embodiment. Especially, when using as a cutting tool for high hardness material machining, the thickness of the coating layer 7 is preferably 0.5 μm to 5 μm. When using as a cutting tool for cast iron machining, the thickness of the coating layer 7 is preferably 1 μm to 3 μm.

The surface roughness of the interface between the substrate 6 and the coating layer 7 is preferably 0.01 to 0.2 μm, for the purposes of smoothing the surface of the coating layer, and enhancing adherence with the coating layer.

<Manufacturing Method>

A method of manufacturing the tool in the fifth embodiment mentioned above will be described below.

For example, as raw material powders, (i) alumina raw material powder having a predetermined mean particle diameter in the range of 0.2 to 3 μm, (ii) magnesia powder having a mean particle diameter of 0.5 to 2 μm, (iii) cobalt oxide powder having a mean particle diameter of 0.1 to 2 μm, and (iv) nickel oxide powder having a mean particle diameter of 0.1 to 2 μm are weighed in a specific composition and milled and mixed.

The obtained mixed powder is then formed in a predetermined shape by using any known molding method such as press molding, slip casting, injection molding, or extrusion molding. Thereafter, the formed body is debindered and sintered at 1500 to 1750° C. in the atmosphere or a non-oxidation atmosphere, preferably in a non-oxidation decompression in an argon gas atmosphere. If desired, the surface of the substrate 6 composed of the obtained alumina ceramics is ground.

Next, the coating layer 7 is formed on the surface of the substrate 6. The coating layer 8 is formed in the same manner as in the first embodiment.

The fifth embodiment is otherwise similar to the first embodiment, and the description thereof is therefore omitted.

EXAMPLES

The following examples illustrate the manner in which the present invention can be practiced. It is understood, however, that the examples are for the purpose of illustration and the invention is not to be regarded as limited to any of the specific materials or condition therein.

Example I-a

To tungsten carbide (WC) powder having a mean mean particle diameter of 0.8 μm, 10 mass % of metal cobalt (Co) powder having a mean particle diameter of 1.2 μm, 0.5 mass % of titanium carbide (TiC) powder having a mean particle diameter of 1.0 μm, and a total of 5 mass % of vanadium carbide (VC) powder and chromium carbide ($Cr_3C_2$) powder were added and mixed. The mixed powder was press formed in a throw away insert shape (CNMA120408). This was subjected to debinding process, and then sintering under vacuum of 0.01 Pa, at 1450° C. for one hour, resulting in a cemented carbide substrate. The substrate was then subjected to cutting edge machining (honing R) by brushing.

The substrate was set in an arc ion plating apparatus and heated to 500° C. Thereafter, a coating layer shown in Table 1 was formed. The film-forming conditions were as follows. That is, a mixed gas of nitrogen gas and argon gas (i.e. nitrogen gas:argon gas=2:8) was admitted into an atmosphere so that the total pressure was 2.5 Pa. Arc current was 100 A, bias voltage was 50V and heating temperature was 500° C. The composition of the coating layer was observed at 500 power by using a scanning electron microscope (VE-8800) manufactured by KEYENCE CORPORATIONS, and the quantitative analysis of the composition was made at an accelerating voltage of 15 kV according to ZAF method, one type of the energy dispersive X-ray analysis (EDX) methods, by using an EDAX analyzer (AMETEK EDAX-VE9800) supplied with the above microscope. The elements, which could not be measured with this method, were measured by irradiating monochrome AlK (200 μm, 35W, 15 kV) from an X-ray source to a measured region of about 200 μm by using an X-ray photoelectron spectroscopy (Quantum2000) manufactured by PHYSICAL ELECTRONICS. The results are shown in Table 1.

The obtained insert (cutting tool) was used to conduct an oxidation test of holding at 900° C. for one hour. The weight of the insert was measured before and after the test, respectively. An increment of the weight was used as an increment of oxidation due to oxidation reaction per specific surface area. A smaller progress of oxidation indicates higher oxidation resistance.

Next, the same insert was used to conduct a cutting test under the following cutting conditions. The results are shown in Table 1.

Cutting method: Turning
Cut Article: SCM450
Cutting speed: 150 m/min
Feed rate: 0.25 mm/rev
Depth of cut: 1.5 mm
Cutting state: Dry
Evaluation method: After a 20-minute cutting, the presence/absence of chipping, the wear width of the flank, and the wear width at the cutting edge.

TABLE 1

| | | | | Insert | | | End mill | |
|---|---|---|---|---|---|---|---|---|
| | Coating layer (Coating layer A) | | | Flank | Nose | | Frank | |
| Sample No. | Composition | Thickness (μm) | Oxidation increment [1] | wear (mm) | Wear (mm) | Cutting edge | Wear (mm) | Cutting edge |
| * I-1 | $Ti_{0.40}Al_{0.45}W_{0.1}Si_{0.05}N$ | 3.0 | 6.5 | 0.30 | 0.32 | Chipping occurred | 0.105 | Chipping occurred |
| I-2 | $Ti_{0.40}Al_{0.50}W_{0.04}Si_{0.03}Mo_{0.03}N$ | 3.0 | 1.1 | 0.15 | 0.16 | Good | 0.046 | Good |
| I-3 | $Ti_{0.42}Al_{0.48}W_{0.04}Si_{0.03}Nb_{0.03}N$ | 3.0 | 1.2 | 0.13 | 0.14 | Good | 0.042 | Good |
| I-4 | $Ti_{0.46}Al_{0.49}W_{0.02}Si_{0.01}Nb_{0.02}N$ | 4.5 | 0.9 | 0.12 | 0.13 | Good | 0.039 | Good |
| I-5 | $Ti_{0.40}Al_{0.48}W_{0.05}Si_{0.02}Ta_{0.05}N$ | 3.0 | 1.1 | 0.15 | 0.16 | Good | 0.048 | Good |
| I-6 | $Ti_{0.40}Al_{0.49}W_{0.05}Si_{0.03}Y_{0.03}N$ | 4.0 | 1.4 | 0.16 | 0.18 | Good | 0.051 | Good |
| I-7 | $Ti_{0.40}Al_{0.48}W_{0.04}Si_{0.03}Hf_{0.05}N$ | 4.5 | 1.4 | 0.14 | 0.15 | Good | 0.050 | Good |
| I-8 | $Ti_{0.36}Al_{0.48}W_{0.04}Si_{0.02}Nb_{0.1}N$ | 2.5 | 1.2 | 0.20 | 0.19 | Good | 0.055 | Good |
| I-9 | $Ti_{0.40}Al_{0.51}W_{0.05}Si_{0.03}Mo_{0.01}N$ | 3.5 | 0.9 | 0.16 | 0.17 | Good | 0.049 | Good |
| I-10 | $Ti_{0.5}Al_{0.45}W_{0.02}Si_{0.01}Nb_{0.02}N$ | 4.0 | 1.2 | 0.19 | 0.21 | Good | 0.058 | Good |
| I-11 | $Ti_{0.40}Al_{0.53}W_{0.03}Si_{0.01}Mo_{0.03}N$ | 4.0 | 0.8 | 0.15 | 0.16 | Good | 0.051 | Good |
| I-12 | $Ti_{0.46}Al_{0.5}W_{0.01}Si_{0.01}Nb_{0.02}N$ | 3.5 | 1.3 | 0.18 | 0.20 | Good | 0.056 | Good |
| I-13 | $Ti_{0.40}Al_{0.48}W_{0.09}Si_{0.01}Mo_{0.02}N$ | 3.5 | 1.0 | 0.2 | 0.22 | Fine chipping occurred | 0.062 | Fine chipping occurred |
| I-14 | $Ti_{0.41}Al_{0.5}W_{0.02}Si_{0.05}Nb_{0.02}N$ | 3.0 | 1.2 | 0.18 | 0.19 | Good | 0.059 | Good |
| I-15 | $Ti_{0.39}Al_{0.48}W_{0.08}Si_{0.03}Mo_{0.02}Co_{0.3}N_{0.7}$ | 4.0 | 2.1 | 0.16 | 0.18 | Good | 0.055 | Good |
| * I-16 | $Ti_{0.45}Al_{0.45}Si_{0.01}B_{0.03}N_{0.97}$ | 3.0 | 10.1 | 0.35 | 0.36 | Large wear | 0.150 | Large wear |
| * I-17 | $Ti_{0.45}W_{0.45}Si_{0.1}N$ | 3.5 | 16.5 | 0.45 | 0.48 | Large wear | 0.210 | Large wear |
| * I-18 | $Ti_{0.40}Al_{0.40}W_{0.10}Si_{0.05}Nb_{0.05}N$ | 3.0 | 9.2 | 0.35 | 0.38 | Large wear | 0.120 | Large wear |
| * I-19 | $Ti_{0.36}Al_{0.60}W_{0.02}Si_{0.01}Mo_{0.01}N$ | 3.5 | 0.9 | 0.36 | 0.38 | Large wear | 0.125 | Large wear |
| * I-20 | $Ti_{0.30}Al_{0.45}W_{0.20}Si_{0.02}Nb_{0.03}N$ | 2.5 | 3.5 | 0.34 | 0.39 | Chipping occurred | 0.115 | Chipping occurred |
| * I-21 | $Ti_{0.40}Al_{0.45}W_{0.02}Si_{0.01}Nb_{0.03}N$ | 4.0 | 1.8 | 0.32 | 0.35 | Large wear | 0.110 | Large wear |
| * I-22 | $Ti_{0.25}Al_{0.48}W_{0.02}Si_{0.05}Nb_{0.20}N$ | 3.0 | 2.5 | 0.36 | 0.38 | Large wear | 0.135 | Large wear |

Mark * means a sample out of the scope of the present invention.
[1] Oxidation increment: oxidation increment after retaining at 900° C. for 1 hour (g/m2)

The following will be noted from Table 1. That is, in Sample No. I-1 and No. I-16, not containing M (at least one selected from Nb, Mo, Ta, Hf and Y), and in Sample No. I-17, not containing Al and M (at least one selected from Nb, Mo, Ta, Hf and Y), the oxidation start temperature of the coating layer was lowered to increase the amount of wear of the tool at the time of cutting. In Sample No. I-18 where "a" (Al content) was smaller than 0.45, the oxidation start temperature of the coating layer was lowered to deteriorate wear resistance. Whereas in Sample No. I-19 where "a" (Al content) was larger than 0.55, the crystal structure of the coating layer was changed in part from cubic crystal to hexagonal crystal, resulting in poor wear resistance of the tool. In Sample I-20 where "b" (W content) exceeded 0.1, the wear resistance of the tool was deteriorated. In Sample No. I-21 where "c" (Si content) was larger than 0.05, wear resistance was lowered. In Sample I-22 where "d" (M content) exceeded 0.1, the wear resistance of the tool was deteriorated.

On the other hand, in Samples Nos. I-2 to I-15, where the composition of the hard layer was in the range of the present invention, the thermal resistance and welding resistance for cut article were improved to exhibit excellent wear resistance, as well as good fracture resistance.

Example I-b

To tungsten carbide (WC) powder having a mean particle diameter of 0.5 μm, 10 mass % of metal cobalt (Co) powder, and a total of 1 mass % of vanadium carbide (VC) powder and chromium carbide ($Cr_3C_2$) powder were added and mixed. The mixed powder was subjected to forming, sintering and grinding, thereby manufacturing a four-flutes end mill having an external diameter of 16 mm. With the same arc ion plating method as in Example I-a, the coating layers having various compositions as shown in Table 1 were formed on the substrate, respectively.

Next, the obtained hard coated end mills were used to conduct a cutting test under the following cutting conditions. The results are shown in Table 1.

Cutting method: Down cut
Cut Article: SCM440
Cutting speed: 80 m/min
Feed rate: 0.08 mm/tooth
Depth of cut: d=18 mm×cross cutting w=1.5 mm
Cutting state: Air blow
Evaluation method: After a 90-minute cutting, the presence/absence of chipping, and the wear width of the flank.

The following will be noted from Table 1. Like the evaluation results of the insert (cutting tool) in Example I-a, in Samples No. I-1 and No. I-16, not containing M (at least one selected from Nb, Mo, Ta, Hf and Y), Sample No. I-17, not containing Al and M (at least one selected from Nb, Mo, Ta, Hf and Y), and Sample No. I-18 where "a" (Al content) was smaller than 0.45, the end mill had a large amount of wear, resulting in poor wear resistance. In Sample No. I-19 where "a" (Al content) was larger than 0.55, Sample No. I-20 where "b" (W content) exceeded 0.1, and Sample No. I-21 where "c" (Si content) was larger than 0.05, these tools had poor wear resistance. In Sample No. I-22 where "d" (M content) exceeded 0.1, the wear resistance of the coating layer was lowered.

On the other hand, in Samples Nos. I-2 to I-15, where the composition of the hard layer was in the range of the present invention, excellent wear resistance and fracture resistance were attained in the end mill machining.

Example I-c

Under the same conditions as in Example I-a, the coating layer as shown in Table 2 were formed on the substrate of Example I-a, and the tool performance was evaluated under the same conditions as in Examples I-a and I-b. The results are shown in Table 2.

TABLE 2

| | | | Insert | | | End mill | |
|---|---|---|---|---|---|---|---|
| Sample | Coating layer | | Flank Wear | Nose Wear | Cutting | Frank Wear | Cutting |
| No. | First layer | Second layer | (mm) | (mm) | edge | (mm) | edge |
| I-23 | $Ti_{0.40}Al_{0.50}W_{0.04}Si_{0.03}Nb_{0.03}N$ | $Ti_{0.47}Al_{0.53}N$ | 0.10 | 0.11 | Good | 0.042 | Good |
| I-24 | $Ti_{0.40}Al_{0.5}W_{0.05}Si_{0.03}Y_{0.02}N$ | $Ti_{0.50}Al_{0.50}N$ | 0.13 | 0.12 | Good | 0.045 | Good |
| I-25 | $Ti_{0.42}Al_{0.50}W_{0.03}Si_{0.03}Nb_{0.02}N$ | TiN | 0.12 | 0.13 | Good | 0.045 | Good |
| I-26 | TiN | $Ti_{0.40}Al_{0.50}W_{0.04}Si_{0.03}Nb_{0.03}N$ | 0.15 | 0.16 | Good | 0.052 | Good |
| * I-27 | $Ti_{0.50}Al_{0.50}N$ | TiN | 0.42 | 0.45 | Chipping occurred | 0.180 | Chipping occurred |
| * I-28 | $Ti_{0.35}Al_{0.40}W_{0.10}Si_{0.05}Nb_{0.10}N$ | $Ti_{0.50}Al_{0.50}N$ | 0.32 | 0.32 | Chipping occurred | 0.120 | Chipping occurred |

Mark * means a sample out of the scope of the present invention.

It will be noted from Table 2 that Samples No. I-27 and No. I-28, not provided with any coating layer, had poor wear resistance and had chipping at the cutting edge. On the other hand, Samples No. I-23 to No. I-26, which were provided with the coating layer of the present invention, were free from chipping, exhibiting excellent wear resistance.

Example I-d

To fine particle tungsten carbide (WC) powder having a mean particle diameter of 0.5 μm, and coarse particle tungsten carbide (WC) powder having a mean particle diameter of 2.5 μm, 6 mass % of metal cobalt (Co) powder having a mean particle diameter of 1.2 μm, and 0.4 mass % of chromium carbide ($Cr_3C_2$) powder were added and mixed by an attritor mill for the time shown in Table 3. The mixed powder was then dried to prepare granules by a spray dryer. Using the resultant granules, the cemented carbide substrate shown in Table 3 was prepared.

TABLE 3

| Sample No. | Manufacturing conditions | | | WC particle size (μm) | | |
|---|---|---|---|---|---|---|
| | Mixing time (hour) | Sintering temperature (°C.) | Sintering time (min.) | Peak top of fine particle side | Peak top of coarse particle side | Mean particle size |
| I-29 | 12 | 1425 | 50 | 0.7 | 2.7 | 0.9 |
| I-30 | 11 | 1450 | 70 | 0.8 | 2.8 | 1.0 |
| I-31 | 20 | 1375 | 60 | 0.4 | 1.5 | 0.6 |

Mark * means a sample out of the scope of the present invention.

The coating layer shown in Table 4 was formed on the surface of the substrate under the same condition as in Examples I-a, and the tool performance was evaluated under the same cutting conditions as in Examples I-a. The result is shown in Table 4.

TABLE 4

| | Coating layer (Coating layer A) | | | Insert | | | End mill | |
|---|---|---|---|---|---|---|---|---|
| Sample No. | Composition | Thickness (μm) | Oxidation increment [1] | Flank wear (mm) | Nose Wear (mm) | Cutting edge | Frank Wear (mm) | Cutting edge |
| I-29 | $Ti_{0.40}Al_{0.50}W_{0.04}Si_{0.03}Mo_{0.03}N$ | 3.0 | 1.1 | 0.10 | 0.11 | Good | 0.036 | Good |
| I-30 | $Ti_{0.40}Al_{0.48}W_{0.05}Si_{0.02}Ta_{0.05}N$ | 3.0 | 1.2 | 0.09 | 0.10 | Good | 0.039 | Good |
| I-31 | $Ti_{0.40}Al_{0.48}W_{0.05}Si_{0.02}Ta_{0.05}N$ | 4.5 | 0.9 | 0.08 | 0.07 | Good | 0.031 | Good |

[1] Oxidation increment: oxidation increment after retaining at 900° C. for 1 hour (g/m2)

Example II

Cutting Tools with a Cemented Carbide Substrate

The granules obtained in Example 1-d were press formed in a predetermined throw away insert shape (DCET11T301), followed by debinding. This was then sintered under vacuum of 0.01 Pa, and under the conditions shown in Table 5, thereby obtaining the cemented carbide substrate.

The substrate was set in an arc ion plating apparatus and heated to 500° C. Thereafter, a coating layer shown in Table 5 was formed. The film-forming conditions and the composition analysis of the coating layer were conducted under the same manner as in Example I-a. The results are shown in Table 5.

The obtained insert was used to conduct a cutting test under the following conditions. The results are shown in Table 5.

Cutting method: Turning
Cut Article: Free cutting steel (SUM23L)
Cutting speed: 100 m/min
Feed rate: 0.08 mm/rev
Depth of cut: 0.5 mm
Cutting state: Dry Evaluation method: After a 100-minute cutting, the presence/absence of chipping, and the surface roughness (Rz) of the cut article.

TABLE 5

| Sample No. | Manufacturing conditions | | | WC particle size (μm) | | | Coating layer (Coating layer A) | | Cutting performance | |
|---|---|---|---|---|---|---|---|---|---|---|
| | Mixing time (hour) | Sintering temperature (°C.) | Sintering time (min.) | Peak top of fine particle side | Peak top of coarse particle side | Mean particle size | Composition | Thickness (μm) | Surface roughness Rz (μm) | Cutting edge |
| * II-1 | 14 | 1400 | 60 | 0.6 | 2.4 | 0.8 | $Ti_{0.40}Al_{0.45}W_{0.1}Si_{0.05}N$ | 1.5 | 12.1 | Chipping occurred |
| II-2 | 12 | 1425 | 50 | 0.7 | 2.7 | 0.9 | $Ti_{0.40}Al_{0.50}W_{0.04}Si_{0.03}Mo_{0.03}N$ | 1.3 | 6.6 | Good |
| II-3 | 12 | 1400 | 60 | 0.5 | 2.5 | 0.8 | $Ti_{0.45}Al_{0.49}W_{0.02}Si_{0.01}Nb_{0.02}N$ | 1.4 | 5.7 | Good |
| II-4 | 11 | 1450 | 70 | 0.8 | 2.8 | 1.0 | $Ti_{0.40}Al_{0.48}W_{0.05}Si_{0.02}Ta_{0.05}N$ | 1.5 | 7.3 | Good |
| II-5 | 13 | 1425 | 50 | 0.6 | 2.1 | 0.7 | $Ti_{0.40}Al_{0.49}W_{0.05}Si_{0.03}Y_{0.03}N$ | 1.4 | 6.3 | Good |
| II-6 | 20 | 1375 | 60 | 0.4 | 1.5 | 0.6 | $Ti_{0.40}Al_{0.48}W_{0.05}Si_{0.02}Ta_{0.05}N$ | 1.2 | 6.1 | Good |
| II-7 | 15 | 1450 | 60 | 0.8 | 2.7 | 0.9 | $Ti_{0.40}Al_{0.45}W_{0.04}Si_{0.03}Hf_{0.05}N$ | 1.1 | 6.8 | Good |
| * II-8 | 14 | 1400 | 60 | 0.6 | 2.6 | 0.8 | $Ti_{0.45}Al_{0.45}Si_{0.1}B_{0.03}N_{0.97}$ | 1.4 | 12.6 | Large wear |

TABLE 5-continued

| | Manufacturing conditions | | | WC particle size (μm) | | | Coating layer (Coating layer A) | | Cutting performance | | |
|---|---|---|---|---|---|---|---|---|---|---|---|
| | | | | Peak top of fine particle side | Peak top of coarse particle side | Mean particle size | Composition | Thickness (μm) | Surface roughness Rz (μm) | Cutting edge | |
| Sample No. | Mixing time (hour) | Sintering temperature (° C.) | Sintering time (min.) | | | | | | | | |
| * II-9 | 13 | 1400 | 60 | 0.6 | 2.3 | 0.7 | $Ti_{0.45}W_{0.45}Si_{0.1}N$ | 1.5 | 13.5 | Large wear | |
| * II-10 | 13 | 1450 | 40 | 0.6 | 2.5 | 0.8 | $Ti_{0.40}Al_{0.40}W_{0.10}Si_{0.05}Nb_{0.05}N$ | 1.1 | 11.9 | Large wear | |
| * II-11 | 14 | 1375 | 60 | 0.5 | 2.6 | 0.7 | $Ti_{0.30}Al_{0.45}W_{0.20}Si_{0.02}Nb_{0.03}N$ | 1.2 | 12.3 | Chipping occurred | |
| * II-12 | 12 | 1425 | 60 | 0.7 | 2.8 | 0.8 | $Ti_{0.40}Al_{0.45}W_{0.02}Si_{0.1}Nb_{0.03}N$ | 1.6 | 11.3 | Large wear | |
| * II-13 | 12 | 1450 | 50 | 0.8 | 2.7 | 1.0 | $Ti_{0.25}Al_{0.48}W_{0.02}Si_{0.05}Nb_{0.20}N$ | 1.4 | 12.8 | Large wear | |
| * II-14 | 15 | 1450 | 40 | 0.7 | 2.3 | 0.9 | $Ti_{0.35}Al_{0.60}W_{0.04}Si_{0.03}Nb_{0.08}N$ | 1.5 | 11.3 | Large wear | |
| * II-15 | 15 | 1400 | 50 | 0.9 | | 0.9 | $Ti_{0.45}Al_{0.495}W_{0.05}Nb_{0.05}N$ | 1.3 | 9.8 | Wear occurred | |
| * II-16 | 10 | 1450 | 40 | 2.4 | | 2.4 | $Ti_{0.44}Al_{0.46}W_{0.05}Si_{0.05}N$ | 1.5 | 10.5 | Wear occurred | |

Mark * means a sample out of the scope of the present invention.

The following will be noted from Table 5. In Sample No. II-1 and No. II-8, not containing M (at least one selected from Nb, Mo, Ta, Hf and Y), and Sample No. II-9, not containing Al and M (at least one selected from Nb, Mo, Ta, Hf and Y), oxidation start temperature was lowered to increase the amount of wear of the tool at the time of cutting. Also, in Sample No. II-10 where "a" (Al content) was smaller than 0.45, the oxidation start temperature of the coating layer A was lowered to deteriorate the wear resistance of the tool. In contrast, in Sample No. II-14 where "a" (Al content) was larger than 0.55, the crystal structure of the coating layer A was changed in part from cubic crystal to hexagonal crystal, and the wear resistance of the tool was deteriorated. In sample II-11 where the "b" (W content) exceeded 0.1, the wear resistance of the tool was deteriorated. In Sample II-12 where "c" (Si content) exceeded 0.05, the wear resistance of the tool was deteriorated. In Sample No. II-13, where "d" (M content) exceeded 0.1, the wear resistance was lowered.

On the other hand, Samples Nos. II-2 to II-7, where the composition of the hard layer was in the range of the present invention, had excellent wear resistance and good fracture resistance.

Example III-a

Cutting Tools with a Cermet Substrate

In the ratios as shown in Table 6, TiCN powder having a mean particle diameter of 0.7 μm, TiN powder having a mean particle diameter of 1.5 μm, TaC powder having a mean particle diameter of 2 μm, NbC powder having a mean particle diameter of 1.5 μm, WC powder having a mean particle diameter of 1.1 μm, ZrC powder having a mean particle diameter of 1.8 μm, VC powder having a mean particle diameter of 1.0 μm, Ni powder having a mean particle diameter of 2.4 μm, and Co powder having a mean particle diameter of 1.9 μm were measured by microtrack method, and these powders were added together. The obtained mixed powder was wet-mixed with isopropyl alcohol (IPA) by using a stainless steel ball mill and cemented carbide balls. To the mixed powder, 3 mass % of paraffin was added and mixed together, and then press molded in a tool shape of DCET11T301 at 200 MPa, followed by sintering under the sintering conditions as shown in Table 6. In the temperature raising steps (b) and (c), $N_2$ atmosphere is shown in Table 1.

In Table 6, the temperature raising rate A means a rate at which a temperature is raised to a raised temperature A, the temperature raising rate B means a rate at which the raised temperature A is raised to a raised temperature B, and the temperature raising rate C means a rate at which the raised temperature B is raised to a raised temperature C. The BC process means a period of time when it passes through the raised temperature B to the raised temperature C, and reaches a temperature lowering point.

The obtained cermet substrate was processed with a diamond grinder, and the preparation of a coating layer and composition analysis thereof were conducted under the same conditions as in Example I-a. The results are shown in Table 8. The thickness of the coating layer was 1.0 μm.

The obtained cutting tool was observed with a scanning electron microscope (SEM). That is, with respect to arbitrary five positions in the surface and the inside of the cutting tool, an image analysis for a region of 7 mm×7 mm was performed on a microphotograph of 7000 power, in order to confirm the existing states of the hard phase (a first hard phase, a second hard phase and a third hard phase). The mean particle diameters of these positions were also measured. The results are shown in Table 7.

The obtained insert was used to conduct a cutting test under the following conditions. The results are shown in Table 8.
Cut Article: Free cutting steel (SUM23L)
Cutting speed: 120 m/min
Feed rate: 0.05 mm/rev
Depth of cut: 0.5 mm
Cutting state: Wet (using oily cutting fluid)
Evaluation method: The surface roughness of the cut surface after a 600-minute process of outer-diameter cutting by a cutting length of 20 mm, from Φ20 mm to Φ10 mm.

TABLE 6

| Sample No. | Material composition (mass %) | | | | | | | | | Sintering conditions | | | | | | |
|---|---|---|---|---|---|---|---|---|---|---|---|---|---|---|---|---|
| | TiCN | TiN | TaC | NbC | WC | ZrC | VC | Ni | Co | Sintering Temp. A (°C.) | Temp. raising rate A (°C./min.) | Sintering Temp. B (°C.) | Temp. raising rate B (°C./min.) | Sintering Temp. C (°C.) | Temp. raising rate C (°C./min.) | Gas atmosphere amount in B, C steps (Pa) |
| III-1 | 50 | 10 | 2 | 12 | 18 | 3 | 1 | 2 | 2 | 1050 | 10 | 1300 | 0.5 | 1500 | 4 | 10 |
| III-2 | 48 | 13 | 0 | 15 | 18 | 1 | 0 | 1 | 4 | 1100 | 10 | 1300 | 1 | 1600 | 14 | 50 |
| III-3 | 45 | 13 | 0 | 10 | 19 | 3 | 1 | 3 | 6 | 1150 | 10 | 1300 | 0.9 | 1550 | 6 | 100 |
| III-4 | 45 | 13 | 5 | 10 | 15 | 3 | 1 | 3 | 5 | 1200 | 5 | 1325 | 0.6 | 1575 | 12 | 150 |
| III-5 | 52 | 13 | 2 | 6 | 14 | 1 | 2 | 3 | 7 | 1250 | 10 | 1325 | 0.6 | 1575 | 8 | 150 |
| III-6 | 69 | 0 | 1 | 1 | 18 | 1 | 1 | 3 | 6 | 1200 | 15 | 1325 | 0.7 | 1550 | 10 | 150 |
| III-7 | 50 | 13 | 3 | 5 | 13 | 1 | 2 | 4 | 9 | 1200 | 12.5 | 1350 | 0.7 | 1575 | 7 | 150 |
| * III-8 | 48 | 12 | 1 | 13 | 20 | 2 | 1 | 1 | 2 | 1050 | 10 | 1350 | 0.7 | 1575 | 7 | 10 |
| * III-9 | 40 | 25 | 5 | 0 | 10 | 2 | 2 | 4 | 12 | 1250 | 10 | 1350 | 0.8 | 1550 | 7 | 10 |
| * III-10 | 45 | 20 | 0 | 3 | 12 | 4 | 0 | 2 | 14 | 1250 | 12 | 1350 | 0.8 | 1550 | 6 | 10 |
| * III-11 | 41 | 16 | 10 | 5 | 15 | 3 | 0 | 4 | 6 | 1200 | 12.5 | 1350 | 0.6 | 1550 | 5 | 30 |
| * III-12 | 40 | 16 | 11 | 10 | 10 | 2 | 1 | 2 | 8 | 1200 | 12.5 | 1350 | 0.6 | 1550 | 5 | 20 |
| * III-13 | 41 | 16 | 10 | 5 | 15 | 3 | 0 | 4 | 6 | 1200 | 12.5 | 1350 | 0.6 | 1550 | 5 | 30 |
| * III-14 | 43 | 14 | 10 | 2 | 15 | 3 | 3 | 4 | 6 | 1050 | 12.5 | 1375 | 1 | 1550 | 5 | — |
| * III-15 | 62 | 19 | 0 | 2 | 5 | 3 | 5 | 1 | 3 | 1050 | 15 | 1375 | 1 | 1500 | 5 | 50 |
| III-16 | 45 | 13 | 0 | 10 | 19 | 3 | 1 | 3 | 6 | 1100 | 12 | 1300 | 1 | 1550 | 4 | 5 |
| III-17 | 50 | 13 | 3 | 5 | 13 | 1 | 2 | 4 | 9 | 1200 | 12 | 1250 | 0.7 | 1575 | 7 | 150 |
| III-18 | 50 | 10 | 2 | 12 | 18 | 3 | 1 | 2 | 2 | 1200 | 12 | 1300 | 0.6 | 1485 | 5 | 155 |
| III-19 | 48 | 13 | 0 | 15 | 18 | 1 | 0 | 1 | 4 | 1250 | 14 | 1300 | 0.6 | 1650 | 5 | 100 |
| III-20 | 48 | 13 | 0 | 15 | 18 | 1 | 0 | 1 | 4 | 1050 | 14 | 1300 | 0.6 | 1500 | 10 | 4 |
| III-21 | 69 | 0 | 1 | 1 | 18 | 1 | 1 | 3 | 6 | 1100 | 14 | 1250 | 0.7 | 1550 | 10 | 10 |
| III-22 | 50 | 13 | 3 | 5 | 13 | 1 | 2 | 4 | 9 | 1200 | 14 | 1300 | 2 | 1550 | 10 | 3 |
| III-23 | 50 | 10 | 2 | 12 | 18 | 3 | 1 | 2 | 2 | 1250 | 14 | 1300 | 0.7 | 1575 | 20 | 50 |
| III-24 | 48 | 13 | 0 | 15 | 18 | 1 | 0 | 1 | 4 | 1200 | 14 | 1350 | 0.6 | 1575 | 4 | 3 |
| III-25 | 48 | 13 | 0 | 15 | 18 | 1 | 0 | 1 | 4 | 1200 | 14 | 1350 | 0.6 | 1575 | 20 | 50 |
| III-26 | 48 | 13 | 0 | 15 | 18 | 1 | 0 | 1 | 4 | 1200 | 14 | 1350 | 0.6 | 1700 | 10 | 100 |
| III-27 | 48 | 13 | 0 | 15 | 18 | 1 | 0 | 1 | 4 | 1200 | 14 | 1350 | 0.6 | 1575 | 20 | 50 |

Mark * means a sample out of the scope of the present invention.

TABLE 7

| Sample No. | Inside region in | | | | | | | Surface region sf | | | | | Surface/Inside ratio | | | Surface region (μm) | Ultrathin surface region (μm) |
|---|---|---|---|---|---|---|---|---|---|---|---|---|---|---|---|---|---|
| | $d_{in}$ | $d_{1in}$ | $d_{2in}$ | $d_{3in}$ | $S_{1in}$ | $S_{2in}$ | $S_{3in}$ | $d_{sf}$ | $S_{1sf}$ | $S_{2sf}$ | $S_{3sf}$ | | $d_{sf}/d_{in}$ | $S_{1sf}/S_{1in}$ | $S_{2sf}/S_{2in}$ | | |
| III-1 | 0.57 | 0.50 | 0.50 | 0.70 | 45 | 35 | 5 | 0.70 | 18 | 66 | 1 | | 1.24 | 0.40 | 1.89 | 30 | 3.6 |
| III-2 | 0.70 | 0.70 | 0.80 | 0.60 | 45 | 30 | 15 | 0.80 | 20 | 70 | 1 | | 1.14 | 0.44 | 2.33 | 33 | 2.2 |
| III-3 | 0.90 | 0.90 | 0.90 | 0.90 | 55 | 35 | 5 | 0.99 | 25 | 80 | 5 | | 1.10 | 0.45 | 2.29 | 32 | 2.7 |
| III-4 | 0.67 | 0.50 | 1.10 | 0.40 | 45 | 20 | 28 | 1.10 | 18 | 70 | 2 | | 1.65 | 0.40 | 3.50 | 38 | 4.2 |
| III-5 | 1.17 | 1.60 | 1.80 | 0.10 | 75 | 15 | 3 | 1.90 | 30 | 66 | 2 | | 1.63 | 0.40 | 4.40 | 48 | 5.0 |
| III-6 | 0.77 | 0.90 | 1.00 | 0.40 | 45 | 40 | 5 | 1.20 | 30 | 65 | 1 | | 1.57 | 0.67 | 1.63 | 39 | 4.9 |
| III-7 | 0.83 | 0.70 | 1.50 | 0.30 | 50 | 35 | 10 | 1.55 | 25 | 70 | 2 | | 1.86 | 0.50 | 2.00 | 57 | 5.0 |
| * III-8 | 0.60 | 0.80 | 0.50 | 0.50 | 75 | 20 | 2 | 0.55 | 30 | 65 | 2 | | 0.92 | 0.40 | 3.25 | 30 | 0.5 |
| * III-9 | 0.93 | 0.90 | 1.30 | 0.60 | 50 | 30 | 5 | 1.43 | 20 | 75 | 4 | | 1.53 | 0.40 | 2.50 | 30 | 2.0 |
| * III-10 | 0.83 | 0.80 | 1.20 | 0.50 | 55 | 25 | 5 | 1.35 | 23 | 73 | 3 | | 1.62 | 0.42 | 2.92 | 30 | 2.0 |
| * III-11 | 0.90 | 0.90 | 1.30 | 0.50 | 80 | 10 | 4 | 1.30 | 30 | 68 | 1 | | 1.44 | 0.38 | 6.80 | 23 | 1.2 |
| * III-12 | 0.88 | 0.85 | 1.30 | 0.50 | 75 | 15 | 5 | 1.26 | 25 | 70 | 2 | | 1.43 | 0.33 | 4.67 | 25 | 1.2 |
| * III-13 | 0.83 | 0.90 | 1.20 | 0.40 | 70 | 18 | 8 | 1.23 | 32 | 68 | 1 | | 1.48 | 0.46 | 3.78 | 30 | 1.2 |
| * III-14 | 0.63 | 0.90 | 0.60 | 0.40 | 65 | 25 | 4 | 0.60 | 30 | 65 | 2 | | 0.95 | 0.46 | 2.60 | なし | 0.8 |
| * III-15 | 0.70 | 0.80 | 0.90 | 0.40 | 50 | 40 | 4 | 1.08 | 25 | 70 | 2 | | 1.54 | 0.50 | 1.75 | 20 | 1.4 |
| III-16 | 0.73 | 0.90 | 0.70 | 0.60 | 44 | 30 | 16 | 0.77 | 25 | 70 | 1 | | 1.05 | 0.57 | 2.33 | 32 | 1.1 |
| III-17 | 0.70 | 0.70 | 0.80 | 0.60 | 65 | 14 | 14 | 0.96 | 20 | 70 | 2 | | 1.37 | 0.31 | 5.00 | 36 | 1.8 |
| III-18 | 0.43 | 0.50 | 0.50 | 0.30 | 50 | 45 | 11 | 0.60 | 30 | 65 | 2 | | 1.38 | 0.60 | 1.44 | 21 | 1.7 |
| III-19 | 1.03 | 0.80 | 1.50 | 0.80 | 48 | 22 | 29 | 1.88 | 25 | 65 | 0 | | 1.81 | 0.52 | 2.95 | 25 | 2.4 |
| III-20 | 0.83 | 0.80 | 1.00 | 0.70 | 45 | 35 | 4 | 1.10 | 31 | 66 | 1 | | 1.32 | 0.69 | 1.89 | 30 | 0.7 |
| III-21 | 1.03 | 0.90 | 1.40 | 0.80 | 75 | 15 | 3 | 1.68 | 30 | 60 | 3 | | 1.63 | 0.40 | 4.00 | 40 | 1.6 |
| III-22 | 0.93 | 0.70 | 1.40 | 0.70 | 50 | 24 | 14 | 1.68 | 30 | 65 | 1 | | 1.80 | 0.60 | 2.71 | 31 | 1.3 |
| III-23 | 0.63 | 0.60 | 0.80 | 0.50 | 55 | 35 | 1 | 1.12 | 30 | 65 | 2 | | 1.77 | 0.55 | 1.86 | 19 | 0.9 |
| III-24 | 0.87 | 0.80 | 0.90 | 0.90 | 53 | 33 | 12 | 0.90 | 15 | 70 | 7 | | 1.04 | 0.28 | 2.12 | 20 | 2.0 |
| III-25 | 0.70 | 0.80 | 0.80 | 0.50 | 70 | 15 | 10 | 0.88 | 30 | 55 | 5 | | 1.26 | 0.43 | 3.67 | 49 | 2.3 |
| III-26 | 0.73 | 1.40 | 0.50 | 0.30 | 68 | 28 | 2 | 0.60 | 30 | 65 | 4 | | 0.82 | 0.44 | 2.32 | 34 | — |
| III-27 | 0.70 | 0.80 | 0.80 | 0.50 | 70 | 15 | 10 | 0.88 | 30 | 55 | 5 | | 1.26 | 0.43 | 3.67 | 49 | 2.3 |

Mark * means a sample out of the scope of the present invention.

TABLE 8

| Sample No. | Coating layer | Surface roughness (μm) |
|---|---|---|
| III-1 | $Ti_{0.35}Al_{0.45}W_{0.1}Si_{0.05}Nb_{0.05}C_{0.3}N_{0.7}$ | 4.95 |
| III-2 | $Ti_{0.40}Al_{0.50}W_{0.04}Si_{0.03}Mo_{0.03}N$ | 4.76 |
| III-3 | $Ti_{0.46}Al_{0.49}W_{0.02}Si_{0.01}Nb_{0.02}N$ | 4.22 |
| III-4 | $Ti_{0.40}Al_{0.48}W_{0.05}Si_{0.02}Ta_{0.05}N$ | 4.41 |
| III-5 | $Ti_{0.40}Al_{0.49}W_{0.05}Si_{0.03}Y_{0.03}N$ | 4.12 |
| III-6 | $Ti_{0.40}Al_{0.48}W_{0.05}Si_{0.02}Ta_{0.05}N$ | 3.81 |
| III-7 | $Ti_{0.40}Al_{0.48}W_{0.04}Si_{0.03}Hf_{0.05}N$ | 3.15 |
| * III-8 | $Ti_{0.36}Al_{0.60}W_{0.02}Si_{0.01}Mo_{0.01}N$ | 8.35 |
| * III-9 | $Ti_{0.2}Al_{0.53}Si_{0.02}Ta_{0.05}N$ | 8.25 |
| * III-10 | $Ti_{0.4}Al_{0.53}Si_{0.02}Ta_{0.05}N$ | Fracture |
| * III-11 | $Ti_{0.40}Al_{0.45}W_{0.05}Si_{0.1}N$ | 7.48 |
| * III-12 | $Ti_{0.26}Al_{0.50}W_{0.02}Si_{0.02}Mo_{0.2}N$ | 7.55 |
| * III-13 | $Ti_{0.45}Al_{0.45}W_{0.05}Si_{0.1}Nb_{0.1}N$ | 7.65 |
| * III-14 | $Ti_{0.40}Al_{0.40}W_{0.10}Si_{0.05}Nb_{0.05}N$ | 6.24 |
| * III-15 | $Ti_{0.56}Al_{0.40}W_{0.02}Si_{0.01}Mo_{0.01}N$ | 7.46 |
| III-16 | $Ti_{0.40}Al_{0.50}W_{0.04}Si_{0.03}Mo_{0.03}N$ | 5.53 |
| III-17 | $Ti_{0.46}Al_{0.49}W_{0.02}Si_{0.01}Nb_{0.02}N$ | 5.85 |
| III-18 | $Ti_{0.40}Al_{0.48}W_{0.05}Si_{0.02}Ta_{0.05}N$ | 5.11 |
| III-19 | $Ti_{0.40}Al_{0.49}W_{0.05}Si_{0.03}Y_{0.03}N$ | 5.93 |
| III-20 | $Ti_{0.30}Al_{0.45}W_{0.20}Si_{0.02}Nb_{0.03}N$ | 5.26 |
| III-21 | $Ti_{0.40}Al_{0.50}W_{0.04}Si_{0.03}Mo_{0.03}N$ | 5.38 |
| III-22 | $Ti_{0.46}Al_{0.49}W_{0.02}Si_{0.01}Nb_{0.02}N$ | 5.42 |
| III-23 | $Ti_{0.40}Al_{0.48}W_{0.05}Si_{0.02}Ta_{0.05}N$ | 5.76 |
| III-24 | $Ti_{0.40}Al_{0.49}W_{0.05}Si_{0.03}Y_{0.03}N$ | 5.91 |
| III-25 | $Ti_{0.40}Al_{0.49}W_{0.05}Si_{0.03}Y_{0.03}N$ | 5.06 |
| III-26 | $Ti_{0.40}Al_{0.49}W_{0.05}Si_{0.03}Y_{0.03}N$ | 5.28 |
| * III-27 | $Ti_{0.45}Al_{0.45}W_{0.05}Nb_{0.05}N$ | 6.11 |

Mark * means a sample out of the scope of the present invention.

The following will be noted from Table 6 to 8. That is, in Sample No. III-8 where "a" (Al content) was larger than 0.55, the crystal structure of the coating layer A was changed in part from cubic crystal to hexagonal crystal, so that the tool had poor wear resistance and hence the finished surface roughness was lowered. In contrast, in Sample No. III-15 where "a" (Al content) was smaller than 0.45, the oxidation start temperature of the coating layer A was lowered to deteriorate the wear resistance of the tool, lowering the finished surface roughness. In Sample III-10 where no W was contained and "b" (W content) was zero, the tool had chipping. In contrast, in Sample No. III-9 where "b" (W content) exceeded 0.1, the tool had poor wear resistance. In these two samples, the finished surface roughness was lowered. In Sample No. III-13 where "c" (Si content) exceeded 0.05, the wear resistance of the tool was deteriorated and the finished surface roughness was lowered. In Sample No. III-11, not containing M (at least one selected from Nb, Mo, Ta, Hf and Y), oxidation start temperature was lowered to increase the amount of wear of the tool at the time of cutting. In contrast, in Sample No. III-12 where "d" (M content) exceeded 0.1, wear resistance was lowered, and the finished surface roughness was lowered.

On the other hand, in Samples Nos. III-1 to III-7 and III-16 to III-26, where the composition of the hard layer was in the range of the present invention, the thermal resistance and deposition resistance were improved to exhibit excellent wear resistance, as well as good fracture resistance. This led to good surface roughness of the finished surface.

Example III-b

A cutting tool (Sample No. III-27) was manufactured in the same conditions as in Sample No. III-7 in Example III-a, except that the tool shape was changed to CNMG120408, and the layer thickness of the coating layer was 3.0 μm. This sample was used to conduct a cutting test under the following conditions.

Cut article: SNCN439
Cutting speed: 300 m/min
Feed rate: 0.20 mm/rev
Depth of cut: 1.0 mm
Cutting state: Wet (aqueous cutting fluid)
Evaluation method: Outer-diameter continuous cutting (the wear width of the flank after a 30-minute process)

As a comparative example, a cutting tool (Sample No. III-28) was manufactured in the same manner as in Sample No. III-14 in Example III-a, except that the tool shape was changed to CNMG120408, and the layer thickness of the coating layer was 3.0 μm. The same cutting evaluation as described above was made.

In Sample No. III-27, the wear width of the flank was 0.094 mm even after an elapse of 30 minutes from the start of cutting. On the other hand, in Sample No. III-28, the wear width of the flank was 0.27 mm after an elapse of 30 minutes from the start of cutting. That is, the wear resistance of Sample No. III-28 was inferior to that of Sample No. III-27.

Example III-c

A cutting tool (Sample No. III-29) was manufactured in the same conditions as in Sample No. III-7 in Example III-a, except that the TiCN powder and the Co powder as the cermet raw materials of the substrate were changed to 30 mass % of TiCN powder having a mean particle diameter of 0.7 μm (the same as Sample No. III-7), 22 mass % of TiCN powder containing 10 mass % of Co, and having a mean particle diameter of 1.0 μm, and 7 mass % of Co powder having a mean particle diameter of 1.9 μm (the same as Sample No. III-7).

In the obtained cutting tool, the existing states of the hard phase (the first hard phase, the second hard phase and the third hard phase) were confirmed under the same conditions as in Example III-a. The results were that $d_{1in}$=0.70 μm, $d_{2in}$=1.50 μm, $d_{3in}$=0.50 μm, $d_{in}$=0.90 μm, $S_{1in}$=55 area %, $S_{2in}$=40 area %, $S_{3in}$=2 area %, $S_{1sf}$=25 area %, $S_{2sf}$=70 area %, $S_{3sf}$=2 area %, $S_{1sf}/S_{1in}$=0.45, and $S_{2sf}/S_{2in}$=1.75. A cutting evaluation was made under the same conditions as in Example III-a. The surface roughness (Rz) of the worked surface of the cut article was 3.31 μm.

Sample No. III-29 was further observed by a transmission electron microscope (TEM). Specifically, the first hard phase having a core structure was observed to check several core part compositions. It was confirmed that there were a core part whose metal composition consists only of Ti, and a core part whose metal composition consisting of Ti and Co.

Example IV-a

Cutting Tool Provided with a Substrate Composed of a cBN Sintered Body

A 50 vol % of cBN raw material powder having a mean particle diameter of 0.8 μm, 40 vol % of TiN raw material powder having a mean particle diameter of 1.2 μm, and 10 vol 6 of Al metal raw material powder having a mean particle diameter of 1.5 μm were prepared. These powders were mixed for 15 hours by a ball mill using alumina balls. The mixed powder was press formed at a pressure 98 MPa. Using an ultra high pressure apparatus, the formed body was sintered by raising temperature at 50° C./min, and holding it at a pressure of 5.0 GPa and at 1500° C. for 15 minutes, and thereafter lowering the temperature at 50° C./min, resulting in a cBN sintered body. The obtained sintered body was cut in predetermined dimensions by wire electro-discharge machining. A cutting edge shoulder formed at the tip of the cutting edge of the cemented carbide substrate was brazed. The cutting edge of the cBN sinter body was subjected to chamfer honing with the use of a diamond wheel.

Preparation of coating layer on the substrate thus obtained (having a throw away tip shape defined in JIS•CNGA120408) and composition analysis thereof were conducted in the same manners as in Example I-a. The results are shown in Table 9 as composition of the coating layer.

The obtained throw away tip (cutting tool) shaped like a grooving cutting tool was used to conduct a cutting test under the following conditions. The results are shown in Table 9.

Cutting method: Light intermittent end face grinding

Cut Article: SCM435 (carburized and hardened steel: 58 to 62 in "c" scale Rockwell hardness (HRC)), with three holes Cutting speed: 150 m/min Feed rate: 0.15 mm/rev Depth of cut: 0.2 mm in shoulder, 0.4 mm in depth Cutting state: Dry Evaluation method: Machining was continued until a fracture occurred, and the evaluation was made based on the number of shocks until the fracture. The presence/absence of chipping was confirmed with a microscope every time the number of shocks reached 300.

TABLE 9

| Sample No. | Coating layer Composition | Thickness (μm) | Shock number until fracture (time) |
|---|---|---|---|
| IV-1 | $(Ti_{0.47}Al_{0.49}W_{0.02}Si_{0.01}Nb_{0.01})N$ | 2.0 | 13540 |
| IV-2 | $(Ti_{0.43}Al_{0.45}W_{0.07}Si_{0.04}Mo_{0.01})N$ | 2.5 | 12056 |
| IV-3 | $(Ti_{0.44}Al_{0.47}W_{0.03}Si_{0.03}Y_{0.03})N$ | 1.8 | 10006 |
| IV-4 | $(Ti_{0.43}Al_{0.48}W_{0.10}Si_{0.01}Hf_{0.01})N$ | 1.5 | 10824 |
| IV-5 | $(Ti_{0.35}Al_{0.45}W_{0.05}Si_{0.05}Nb_{0.10})C_{0.5}N_{0.5}$ | 0.8 | 12520 |
| IV-6 | $(Ti_{0.45}Al_{0.46}W_{0.04}Si_{0.02}Nb_{0.03})N$ | 3.5 | 13232 |
| IV-7 | $(Ti_{0.41}Al_{0.50}W_{0.05}Si_{0.03}Nb_{0.01})N$ | 4.2 | 12864 |
| IV-8 | $(Ti_{0.46}Al_{0.50}W_{0.02}Si_{0.01}Mo_{0.01})N$ | 1.5 | 13144 |
| IV-9 | $(Ti_{0.33}Al_{0.54}W_{0.07}Si_{0.05}Nb_{0.01})N$ | 2.8 | 11886 |
| IV-10 | $(Ti_{0.48}Al_{0.47}W_{0.02}Nb_{0.02}Si_{0.01})N$ | 0.5 | 12324 |
| * IV-11 | TiCN | 1.2 | 3298 |
| * IV-12 | $(Ti_{0.5}Al_{0.5})N$ | 3 | 7760 |
| * IV-13 | $(Ti_{0.7}Al_{0.3})N$ | 1.8 | 6984 |
| * IV-14 | $(Ti_{0.4}Al_{0.45}Si_{0.05}Nb_{0.1})N$ | 3.5 | 7924 |
| * IV-15 | $(Ti_{0.38}Al_{0.5}Si_{0.12})N$ | 2.1 | 5432 |
| * IV-16 | $Ti_{0.36}AlW_{0.02}Si_{0.01}Mo_{0.01}N$ | 3.2 | 8508 |
| * IV-17 | $Ti_{0.2}Al_{0.53}WSi_{0.02}Ta_{0.05}N$ | 2.2 | 6824 |
| * IV-18 | $Ti_{0.40}Al_{0.45}W_{0.05}SiN(Nbなし)$ | 1.5 | 7356 |
| * IV-19 | $Ti_{0.26}Al_{0.50}W_{0.02}Si_{0.02}MoN$ | 2.5 | 7882 |
| * IV-20 | $Ti_{0.30}Al_{0.45}W_{0.05}Si_{0.1}Nb_{0.1}N$ | 3 | 7545 |
| * IV-21 | $Ti_{0.56}Al_{0.40}W_{0.02}Si_{0.01}Mo_{0.01}N$ | 1.8 | 8224 |
| * IV-22 | $Ti_{0.45}Al_{0.45}W_{0.05}Mo_{0.05}N$ | 1.8 | 9532 |

Mark * means a sample out of the scope of the present invention.

The following will be noted from Table 9. That is, in Sample No. IV-16 where "a" (Al composition ratio) was larger than 0.55, the crystal structure of the coating layer was changed in part from cubic crystal to hexagonal crystal, so that the wear resistance of the tool was poor and hence crater wear was advanced. In contrast, in Sample No. IV-21 where "a" (Al composition ratio) was smaller than 0.45, the oxidation start temperature of the coating layer was low, so that the wear resistance of the tool was poor and hence crater wear was advanced. In Sample No. IV-14 where no W was contained and "b" (W composition ratio) was zero, the tool had chipping. Whereas in Sample No. IV-17 where "b" (W composition ratio) exceeded 0.1, the tool had poor wear resistance. That is, both had a short tool life. In Samples Nos. IV-15, IV-18 and IV-20, where "c" (Si composition ratio) exceeded 0.05, the wear resistance of the tool was deteriorated and hence crater wear was advanced. In Samples No. IV-11 to Nos. IV-13, IV-15 and IV-18, not containing M (at least one selected from Nb, Mo, Ta, Hf and Y), oxidation start temperature was lowered to increase the amount of wear of the tool at the time of cutting. In contrast, in Sample No. IV-19 where "d" (M composition ratio) exceeded 0.1, wear resistance was lowered and hence crater wear was advanced, resulting a short tool life.

On the other hand, in Samples Nos. IV-1 to IV-10, where the composition of the hard layer was in the range of the present invention, the oxidation resistance was improved to exhibit excellent wear resistance, as well as good fracture resistance. This led to a long tool life.

Example IV-b

A cBN powder having a mean particle diameter of 0.8 μm, TiC powder having a mean particle diameter of 1.0 μm, TiN powder having a mean particle diameter of 1.2 μm, TiCN powder having a mean particle diameter of 1.5 μm, ZrC powder having a mean particle diameter of 1.2 μm, ZrN powder having a mean particle diameter of 1.2 μm, WC powder having a mean particle diameter of 0.9 μm, HfC powder having a mean particle diameter of 1.0 μm, Al metal powder having a mean particle diameter of 1.5 μm, and metal Co powder having a mean particle diameter of 0.8 μm were prepared to obtain the composition shown in Table 10. These powders were mixed with a ball mill using alumina balls for 15 hours. The mixed powder was press formed at a pressure 98 MPa. Using an ultra high-pressure high-temperature apparatus, the formed body was sintered as follows. That is, the temperature thereof was raised at the rate shown in Table 10, and sintered at the temperature for a period of time shown in Table 10, under a pressure of 5.0 GPa, and thereafter, the temperature was lowered at the temperature lowing rate shown in Table 10, resulting in a cBN sintered body. From the obtained sintered body, a cutting tool was obtained through the same steps as in Example IV-a. Separately, a coating layer was formed under the same conditions as in Sample No. IV-7 of Example IV-a, except that the layer thickness of the coating layer was 3.0 μm (Samples Nos. IV-22 to IV-31). These samples were used to conduct the cutting evaluation as described above. The results are shown in Table 11.

TABLE 10

| Sample No. | Mixing composition (vol. %) | | | | Sintering conditions | | | |
|---|---|---|---|---|---|---|---|---|
| | cBN | Binder phase | | | Temp. raising rate (° C./min.) | Sintering Temp. (° C.) | Sintering time (min.) | Temp. lowering rate (° C./min.) |
| IV-22 | 60 | TiC: 8 | TiN: 25 | Al: 7 | — | 50 | 1400 | 15 | 50 |
| IV-23 | 52 | TiC: 20 | TiN: 18 | Al: 8 | Ni: 2 | 30 | 1300 | 15 | 45 |
| IV-24 | 55 | ZrC: 15 | ZrN: 20 | Al: 10 | — | 40 | 1400 | 15 | 30 |
| IV-25 | 80 | WC: 15 | Co: 5 | — | — | 50 | 1600 | 30 | 50 |
| IV-26 | 96 | Al: 4 | — | — | — | 50 | 1500 | 60 | 50 |
| IV-27 | 65 | TiN: 25 | Al: 8 | Co: 2 | — | 30 | 1450 | 20 | 45 |
| IV-28 | 40 | TiC: 50 | Al: 10 | — | — | 40 | 1450 | 30 | 30 |
| IV-29 | 54 | TiCN: 38 | Al: 8 | — | — | 50 | 1500 | 30 | 50 |
| IV-30 | 65 | WC: 5 | TiN: 20 | Al: 8 | Co: 2 | 30 | 1350 | 40 | 40 |
| IV-31 | 58 | HfC: 10 | TiC: 25 | Al: 7 | — | 50 | 1450 | 30 | 100 |

TABLE 11

| Sample No. | Sintered Body composition (vol. %) | | | | | Cutting performance (Shock number until fracture(time)) |
|---|---|---|---|---|---|---|
| | cBN | Binder phase | | | | |
| IV-22 | 58 | TiC: 7 | TiN: 23 | AlN: 6 | TiB$_2$: 6 | — | 15132 |
| IV-23 | 50 | TiC: 18 | TiN: 16 | AlN: 7 | Ni: 2 | TiB2: 7 | 14724 |
| IV-24 | 53 | ZrC: 14 | ZrN: 19 | AlN: 8 | ZrB$_2$: 6 | — | 10824 |
| IV-25 | 79 | WC: 14 | Co: 4 | WCoB: 3 | — | — | 10282 |
| IV-26 | 94 | AlN: 2 | AlB$_2$: 4 | — | — | — | 10058 |
| IV-27 | 65 | TiN: 21 | AlN: 7 | Co: 2 | TiB$_2$: 5 | — | 13326 |
| IV-28 | 38 | TiC: 46 | AlN: 6 | Al$_2$O$_3$: 3 | TiB$_2$: 7 | — | 11882 |
| IV-29 | 52 | TiCN: 34 | AlN: 7 | TiB$_2$: 7 | — | — | 13144 |
| IV-30 | 63 | WC: 4 | TiN: 18 | AlN: 7 | TiB$_2$: 6 | WCoB: 2 | 13774 |
| IV-31 | 55 | HfC: 10 | TiC: 23 | AlN: 6 | TiB$_2$: 6 | — | 13428 |

All of the samples exhibited a long-life cutting performance. Among others, Samples No. IV-22 and No. IV-23, where TiN and TiC coexisted in the cBN sintered body, exhibited a good cutting performance.

Example V

Cutting Tool Provided with a Substrate Composed of Alumina Ceramics

Alumina powder having a mean particle diameter of 0.5 μm, magnesia powder having a mean particle diameter of 1 μm, cobalt oxide powder having a mean particle diameter of 1 μm and nickel oxide powder having a mean particle diameter of 1 μm were prepared as shown in Table 12. These powders were mixed with a ball mill using alumina balls for 72 hours. The mixed powder was press formed in a throw away tip shape of JIS•CNGA120408 at a pressure 98 MPa. The formed body was then subjected to debinding process, followed by sintering at 1650° C. in a non-oxidation atmosphere of argon (Ar) gas of 0.04 MPa, resulting in an alumina ceramics substrate. Both main surfaces of the alumina ceramics substrate were ground, and a cutting edge part of the substrate was subjected to chamfer honing with the use of a diamond wheel, so that a honing R (R=0.02 mm) was formed at the tip of the cutting edge.

Preparation of coating layer on the substrate thus obtained and composition analysis were conducted in the same manners as in Example I-a. The roughness of the interface was estimated by calculating the traced lines in accordance with the calculation method of arithmetic mean height (Ra) as defined in JISB0601-2001. The results are shown as the composition of the coating layer, in Table 13.

The obtained throw away tip (cutting tool) shaped like a cutting tool was used to conduct a cutting test under the following conditions. The results are shown in Table 13.

Cutting method: Outer peripheral machining
Cut article: SKD11
Cutting speed: 150 m/min
Feed rate: 0.5 mm/rev
Depth of cut: 0.5 mm
Cutting state: Dry
Evaluation method: The time when the flank wear reached 0.3 mm or more, or an elapse of time until flaking or fracture occurred.

TABLE 12

| Sample No. | Mixing composition (mass %) | | | | | | Interface roughness (μm) |
|---|---|---|---|---|---|---|---|
| | Al$_2$O$_3$ | MgO | Other additive | | CoO | NiO | Co + Ni | |
| V-1 | 70 | 0.1 | TiC | 29.8 | 0.1 | 0 | 0.1 | 0.1 |
| V-2 | 62 | 0.2 | TiCN | 36 | 1.8 | 0 | 1.8 | 0.15 |
| V-3 | 73 | 0.05 | TiCN | 25 | 1.1 | 0.85 | 1.95 | 0.05 |
| V-4 | 70 | 0.1 | TiC | 29.8 | 0.05 | 0.05 | 0.1 | 0.1 |
| V-5 | 70 | 0.1 | SiC | 29.8 | 0.1 | 0 | 0.1 | 0.1 |
| V-6 | 39 | 0.1 | TiC | 60 | 0.4 | 0.5 | 0.9 | 0.15 |
| V-7 | 29 | 0.5 | TiCN | 70 | 0.1 | 0.4 | 0.4 | 0.16 |
| V-8 | 20.1 | 1 | TiC | 74 | 4.9 | 0 | 4.9 | 0.2 |
| V-9 | 81.7 | 0.3 | SiC | 18 | 0 | 0 | 0 | 0.3 |

TABLE 12-continued

| Sample No. | Mixing composition (mass %) | | | | | | Interface roughness (µm) |
|---|---|---|---|---|---|---|---|
| | Al$_2$O$_3$ | MgO | Other additive | | CoO | NiO | Co + Ni | |
| V-10 | 70.5 | 0.5 | TiC | 29 | 0 | 0 | 0 | 0.5 |
| * V-11 | 70 | 0.1 | TiC | 29.8 | 0.1 | 0 | 0.1 | 0.1 |
| * V-12 | 65 | 0.2 | TiC | 30 | 3 | 1.9 | 4.9 | 0.1 |
| * V-13 | 89.8 | 0.3 | TiC | 9.8 | 0 | 0.1 | 0.1 | 0.2 |
| * V-14 | 70 | 0.3 | TiC | 29.8 | 0 | 0.1 | 0.1 | 0.2 |
| * V-15 | 75 | 0.1 | TiCN | 24.9 | 0.2 | 0 | 0.2 | 0.1 |
| * V-16 | 85 | 0.1 | TiC | 14.8 | 0 | 0.1 | 0.1 | 0.1 |
| * V-17 | 90 | 0.1 | TiC | 9.8 | 0 | 0.1 | 0.1 | 0.05 |
| * V-18 | 74.7 | 0.3 | TiC | 24.8 | 0.1 | 0.1 | 0.2 | 0.15 |
| * V-19 | 70 | 0.1 | TiCN | 29.8 | 0.1 | 0 | 0.1 | 0.15 |
| * V-20 | 79.8 | 0.1 | SiC | 20 | 0.2 | 0 | 0.2 | 0.15 |
| * V-21 | 70 | 0.1 | TiC | 29.8 | 0 | 0.1 | 0.1 | 0.1 |
| * V-22 | 70 | 0.1 | TiC | 29.8 | 0 | 0.1 | 0.1 | 0.1 |

Mark * means a sample out of the scope of the present invention.

Sample No. V-20 where c (Si composition ratio) exceeded 0.05, the wear resistance of the tool was poor and hence crater wear was advanced. In Samples Nos. V-11 to V-13, 15 and 18, not containing M (at least one selected from Nb, Mo, Ta, Hf and Y), oxidation start temperature was lowered to increase the amount of wear of the tool at the time of cutting. In contrast, in Sample No. V-19 where "d" (M composition ratio) exceeded 0.1, wear resistance was lowered and hence crater wear was advanced, resulting a short tool life.

On the other hand, in Samples Nos. V-1 to V-10, where the composition of the hard layer was in the range of the present invention, the oxidation resistance was improved to exhibit excellent wear resistance, as well as good fracture resistance. This led to a long tool life.

What is claimed is:

1. A cutting tool comprising a substrate and a coating layer for coating a surface of the substrate, wherein the coating layer comprises Ti$_{1-a-b-c-d}$Al$_a$W$_b$Si$_c$Nb$_d$(C$_x$N$_{1-x}$), wherein $0.45 \leq a \leq 0.55$, $0.01 \leq b \leq 0.1$, $0.01 \leq c \leq 0.05$, $0.01 \leq d \leq 0.1$, and $0 \leq x \leq 1$.

TABLE 13

| Sample No. | Coating layer | | Tool | |
|---|---|---|---|---|
| | Composition | Thickness (µm) | Life (min.) | Status of cutting edge |
| V-1 | (Ti$_{0.47}$Al$_{0.49}$W$_{0.02}$Si$_{0.01}$Nb$_{0.01}$)N | 2.0 | 70 | Good |
| V-2 | (Ti$_{0.45}$Al$_{0.46}$W$_{0.04}$Si$_{0.02}$Nb$_{0.03}$)N | 3.5 | 68 | Good |
| V-3 | (Ti$_{0.46}$Al$_{0.50}$W$_{0.02}$Si$_{0.01}$Mo$_{0.01}$)N | 1.5 | 67 | Good |
| V-4 | (Ti$_{0.41}$Al$_{0.50}$W$_{0.05}$Si$_{0.03}$Nb$_{0.01}$)N | 4.2 | 65 | Good |
| V-5 | (Ti$_{0.35}$Al$_{0.45}$W$_{0.05}$Si$_{0.05}$Nb$_{0.10}$)C$_{0.5}$N$_{0.5}$ | 0.8 | 64 | Good |
| V-6 | (Ti$_{0.48}$Al$_{0.47}$W$_{0.02}$Nb$_{0.02}$Si$_{0.01}$)N | 6.5 | 63 | Good |
| V-7 | (Ti$_{0.43}$Al$_{0.45}$W$_{0.07}$Si$_{0.04}$Mo$_{0.01}$)N | 2.5 | 63 | Good |
| V-8 | (Ti$_{0.33}$Al$_{0.54}$W$_{0.07}$Si$_{0.05}$Nb$_{0.01}$)N | 8.5 | 61 | Good |
| V-9 | (Ti$_{0.43}$Al$_{0.48}$W$_{0.10}$Si$_{0.01}$Hf$_{0.01}$)N | 1.5 | 60 | Good |
| V-10 | (Ti$_{0.44}$Al$_{0.47}$W$_{0.03}$Si$_{0.05}$Y$_{0.03}$)N | 1.8 | 58 | Good |
| * V-11 | TiCN | 1.2 | 43 | Large wear |
| * V-12 | (Ti$_{0.5}$Al$_{0.5}$)N | 3 | 45 | Large wear |
| * V-13 | (Ti$_{0.7}$Al$_{0.3}$)N | 1.8 | 40 | Large wear |
| * V-14 | (Ti$_{0.4}$Al$_{0.45}$Si$_{0.05}$Nb$_{0.1}$)N | 3.5 | 41 | Flaking |
| * V-15 | (Ti$_{0.36}$Al$_{0.5}$Si$_{0.12}$)N | 2.1 | 43 | Large wear and Flaking |
| * V-16 | Ti$_{0.36}$AlW$_{0.02}$Si$_{0.01}$Mo$_{0.01}$N | 3.2 | 42 | Large wear |
| * V-17 | Ti$_{0.2}$Al$_{0.53}$W$_{0.20}$Si$_{0.02}$Ta$_{0.05}$N | 3 | 45 | Large wear and Flaking |
| * V-18 | Ti$_{0.40}$Al$_{0.45}$W$_{0.10}$Si$_{0.05}$N | 1.5 | 43 | Large wear |
| * V-19 | Ti$_{0.26}$Al$_{0.50}$W$_{0.02}$Si$_{0.02}$MoN | 2.5 | 45 | Large wear |
| * V-20 | Ti$_{0.30}$Al$_{0.45}$W$_{0.05}$Si$_{0.1}$Nb$_{0.1}$N | 3 | 44 | Large wear |
| * V-21 | Ti$_{0.56}$Al$_{0.40}$W$_{0.02}$Si$_{0.01}$Mo$_{0.01}$N | 2.2 | 40 | Large wear |
| * V-22 | Ti$_{0.45}$Al$_{0.45}$W$_{0.05}$Mo$_{0.05}$N | 2.2 | 52 | Wear occurred |

Mark * means a sample out of the scope of the present invention.

The following will be noted from Tables 12 and 13. That is, in Sample No. V-16 where "a" (Al composition ratio) was larger than 0.55, the crystal structure of the coating layer was changed in part from cubic crystal to hexagonal crystal, so that the wear resistance of the tool was deteriorated and hence crater wear was advanced. In contrast, in Sample No. V-21 where "a" (Al composition ratio) was smaller than 0.45, oxidation start temperature was low, so that the wear resistance of the tool was deteriorated and hence crater wear was advanced. In Samples No. V-14 and No. V-15, where no W was contained and "b" (W composition ratio) was zero, the tool caused flaking. In contrast, in Sample No. V-17 where "b" (W composition ratio) exceeded 0.1, the tool had poor wear resistance. Hence, these samples had a short tool life. In 2. The cutting tool according to claim 1, further having, in addition to the coating layer, a second layer composed of at least one selected from the group consisting of carbides, nitrides and carbonitrides of Al and the elements of the groups 4, 5 and 6 of the periodic table, wherein said second layer is disposed on the coating layer.

3. The cutting tool according to claim 1, wherein the substrate is a cemented carbide substrate comprising a hard phase and a binder phase, and the hard phase comprising a tungsten carbide phase having two peak tops in a particle size distribution, the two peak tops comprising a peak top on a fine particle side having a particle size of 0.1 to 0.8 µm, and a peak top on a coarse particle side having a particle size of 1.5 to 3.0 µm, the tungsten carbide phase being bound by 5 to 7 mass % of a binder phase.

4. The cutting tool according to claim 3, wherein the tungsten carbide phase has a mean particle diameter of 0.5 to 1.0 µm.

5. The cutting tool according to claim 1, wherein
the substrate is a cermet substrate comprising a binder phase composed of an iron family metal, and a hard phase comprising carbon nitride of metals, wherein said carbon nitride of metals comprises Ti, W, and at least one other metal selected from the groups 4, 5 and 6 of the periodic table and Ti is contained in the largest amount;
the hard phase in the inside of the cermet substrate has a mean particle diameter $d_{in}$ of 0.1 to 1.5 µm; and
there exists a surface layer region where the concentration of W is increased from the inside to the surface in the cermet substrate.

6. The cutting tool according to claim 5, wherein in a cross-section of the cermet substrate observed by a scanning electron micrograph, the hard phase is formed by (i) a combination of a first hard phase having a core structure where a grayish white peripheral part exists around a black core part, and a second hard phase having a grayish white monostructure, and (ii) a combination of the first hard phase, the second hard phase and a third hard phase having a black monostructure, the first hard phase in the inside of the cermet substrate having a mean particle diameter $d_{1in}$ of 0.1 to 1.3 µm, the second hard phase having a mean particle diameter $d_{2in}$ of 0.2 to 1.5 µm, and the third hard phase having a mean particle diameter $d_{3in}$ of 0.2 to 2.0 µm.

7. The cutting tool according to claim 6, wherein in an internal structure of the cermet substrate observed by a scanning electron micrograph, an area ratio $S_{1in}$ of the first hard phase is 40 to 80 area %, an area ratio of $S_{2in}$ of the second hard phase is 5 to 40 area %, and an area ratio $S_{3in}$ of the third hard phase is 0 to 30 area %, to the entire structure.

8. The cutting tool according to claim 6, wherein in the hard phase, the black core part and the third hard phase contain at least 80 mass % of Ti, and the grayish white peripheral part of the first hard phase and the second hard phase contain a larger amount of metal other than Ti in the groups 4, 5 and 6 of the periodic table, than the black part of the first hard phase.

9. The cutting tool according to claim 6, wherein part of the core part of the first hard phase contains an iron family metal.

10. The cutting tool according to claim 6, wherein the ratio of a mean particle diameter $d_{sf}$ of the hard phase in the surface layer region and the mean particle diameter $d_{in}$ ($d_{sf}/d_{in}$) is 1.1 to 1.8.

11. The cutting tool according to claim 7, wherein the ratio of an area ratio $S_{1sf}$ of the first hard phase in the surface layer region and the area ratio $S_{1in}$ ($S_{1sf}/S_{1in}$) is 0.3 to 0.7, and the ratio of an area ratio $S_{2sf}$ of the second hard phase in the surface layer region and the area ratio $S_{2in}$ ($S_{2sf}/S_{2in}$) is 1.5 to 4.

12. The cutting tool according to claim 6, wherein in a cross-section of the cermet substrate observed by a scanning electron micrograph, a ultrathin surface region where an area ratio $S_{1ss}$ of the first hard phase is at least 80 area % exists in a depth region of not more than 5 µm in a surface part of the surface layer region.

13. The cutting tool according to claim 1, wherein the substrate is made up of a cBN sintered body.

14. The cutting tool according to claim 13, a binder phase in the cBN sintered body contains TiN and TiC.

15. The cutting tool according to claim 1, wherein the substrate is composed of alumina ceramics containing, in a matrix of alumina particles, 10 to 90 mass % of at least one of titanium and silicon carbides, nitrides, carbonitrides and oxi-carbonitrides.

16. The cutting tool according to claim 15, wherein the alumina ceramics further contains at least one of cobalt and nickel in a ratio of 0.05 to 10 mass %.

17. The cutting tool according to claim 15, wherein the interface roughness between the substrate and the coating layer is 0.01 to 0.2 µm.

18. The cutting tool according to claim 15, wherein the coating layer has a thickness of 0.5 to 10 µm.

19. A method for manufacturing a cut article by using a cutting tool, which comprises:
putting a cutting edge of the cutting tool according to claim 1 to an uncut article to obtain the cut article.

* * * * *